(12) United States Patent
Kao et al.

(10) Patent No.: US 12,575,454 B2
(45) Date of Patent: Mar. 10, 2026

(54) BONDING STRUCTURES FOR SEMICONDUCTOR DEVICES AND METHODS OF FORMING THE SAME

(71) Applicant: Taiwan Semiconductor Manufacturing Company Limited, Hsinchu (TW)

(72) Inventors: Chin-Fu Kao, Taipei (TW); Amram Eitan, Hsinchu (TW); Kai-Hsiang Yang, Hsinchu (TW); Ju-Pin Sun, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 427 days.

(21) Appl. No.: 18/188,597

(22) Filed: Mar. 23, 2023

(65) Prior Publication Data

US 2024/0321817 A1 Sep. 26, 2024

(51) Int. Cl.
*H01L 23/00* (2006.01)
*H01L 25/065* (2023.01)

(52) U.S. Cl.
CPC .............. *H01L 24/80* (2013.01); *H01L 24/03* (2013.01); *H01L 24/05* (2013.01); *H01L 24/08* (2013.01); *H01L 24/16* (2013.01); *H01L 25/0657* (2013.01); *H01L 2224/03848* (2013.01); *H01L 2224/0519* (2013.01); *H01L 2224/08148* (2013.01); *H01L 2224/16147* (2013.01); *H01L 2224/80203* (2013.01);
(Continued)

(58) Field of Classification Search
CPC ... H01L 2224/03848; H01L 2224/0519; H01L 2224/08148; H01L 2224/16147; H01L 2224/80203; H01L 2224/80895; H01L 2224/80896; H01L 2225/06513; H01L 24/03; H01L 24/05; H01L 24/08; H01L 24/16; H01L 24/80; H01L 25/0657; H01L 25/50
See application file for complete search history.

(56) References Cited

U.S. PATENT DOCUMENTS

| | | | | |
|---|---|---|---|---|
| 11,810,891 | B2 * | 11/2023 | Shah | ........................ H01L 25/50 |
| 11,911,839 | B2 * | 2/2024 | Shah | ........................ H01L 24/80 |

(Continued)

*Primary Examiner* — Telly D Green
(74) *Attorney, Agent, or Firm* — The Marbury Law Group, PLLC

(57) ABSTRACT

An embodiment method of forming a hybrid bond between a first semiconductor device component and a second semiconductor device component may include forming the first semiconductor device component including a first electrical bonding structure formed within a first dielectric material; forming the second semiconductor device component including a second electrical bonding structure formed within a second dielectric material; placing the first semiconductor device component and the second semiconductor device component together such that the first electrical bonding structure is in contact with the second electrical bonding structure; performing a first annealing process that forms a direct metal-to-metal bond between the first electrical bonding structure and the second electrical bonding structure; and performing a second annealing process that forms a direct dielectric-to-dielectric bond between the first dielectric material and the second dielectric material.

20 Claims, 16 Drawing Sheets

200

(52) U.S. Cl.
    CPC ............... *H01L 2224/80895* (2013.01); *H01L 2224/80896* (2013.01); *H01L 2225/06513* (2013.01)

(56)                References Cited

U.S. PATENT DOCUMENTS

2023/0201952 A1 *    6/2023    Shah ...................... H01L 24/05
                                                    228/3.1
2024/0113078 A1 *    4/2024    Noguchi ................ H01L 25/18

* cited by examiner

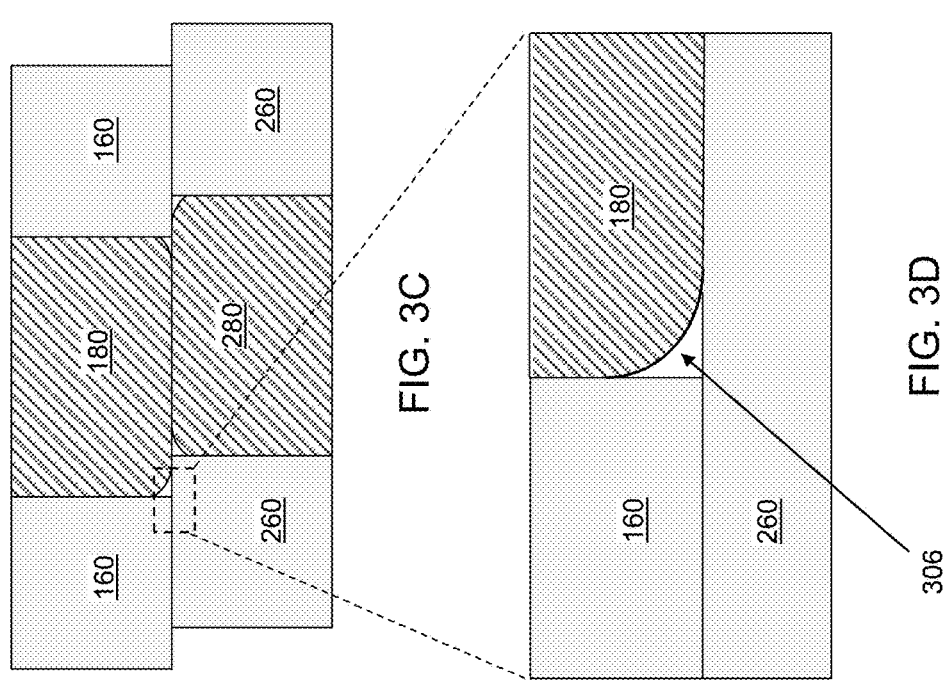
FIG. 3C
FIG. 3D
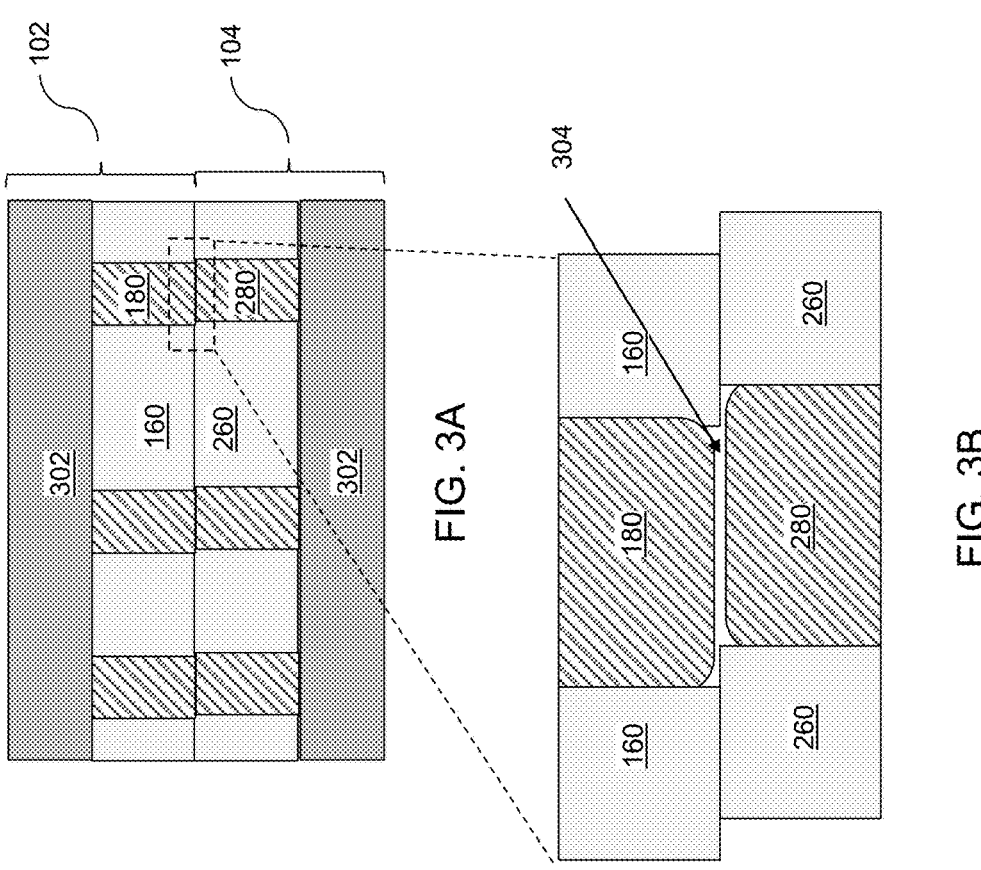
FIG. 3A
FIG. 3B

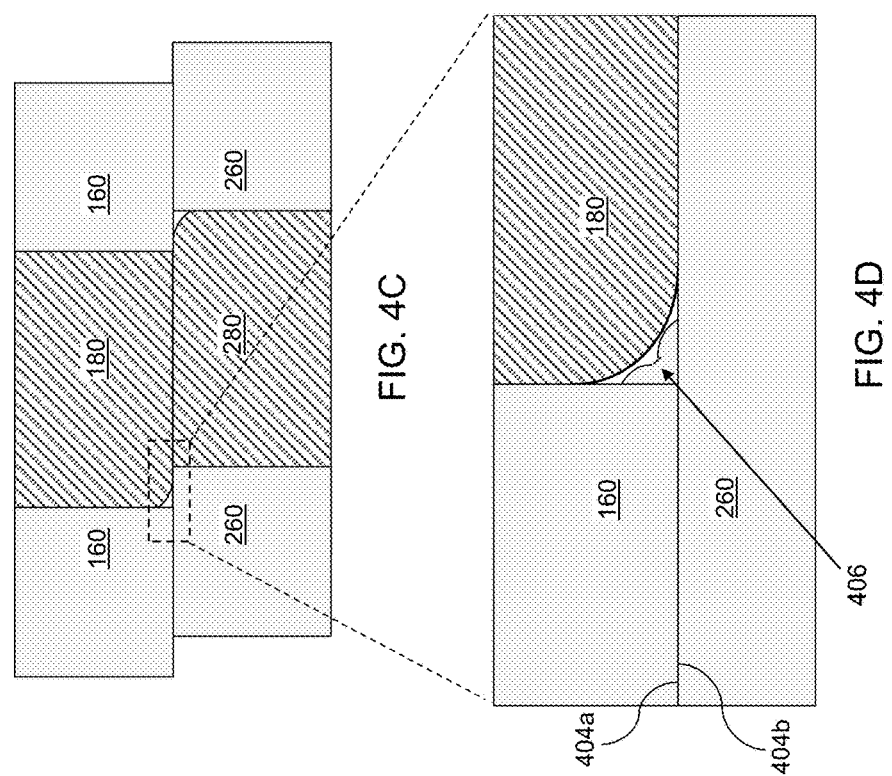
FIG. 4C
FIG. 4D
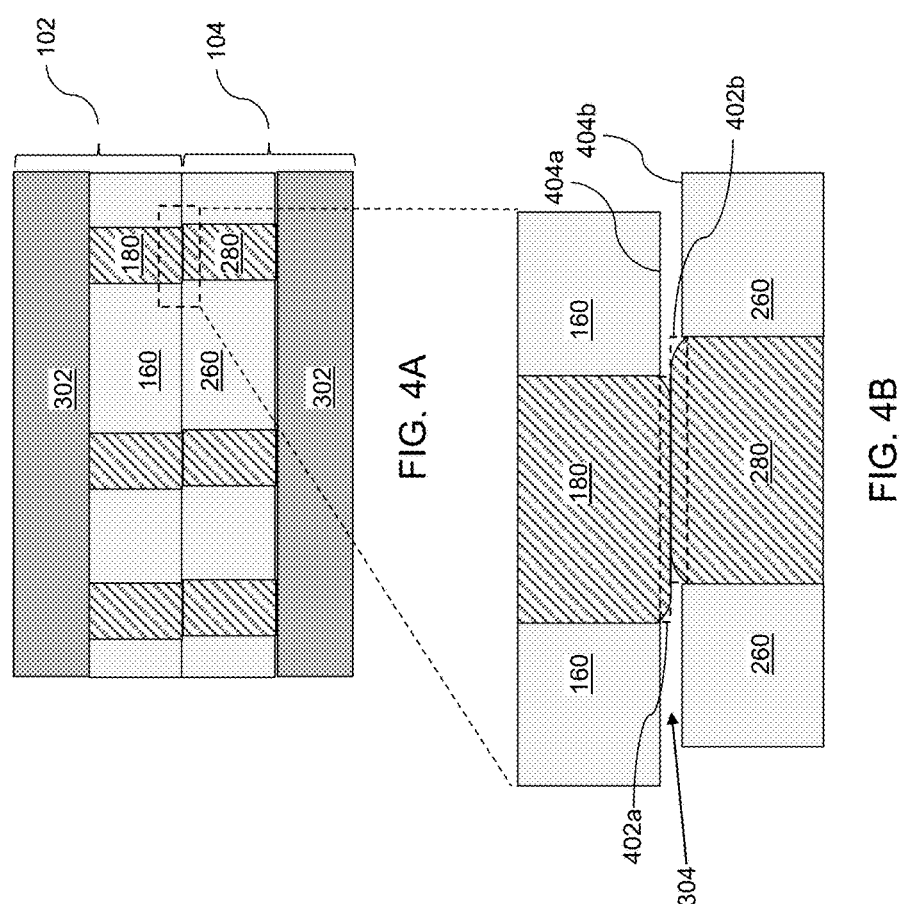
FIG. 4A
FIG. 4B

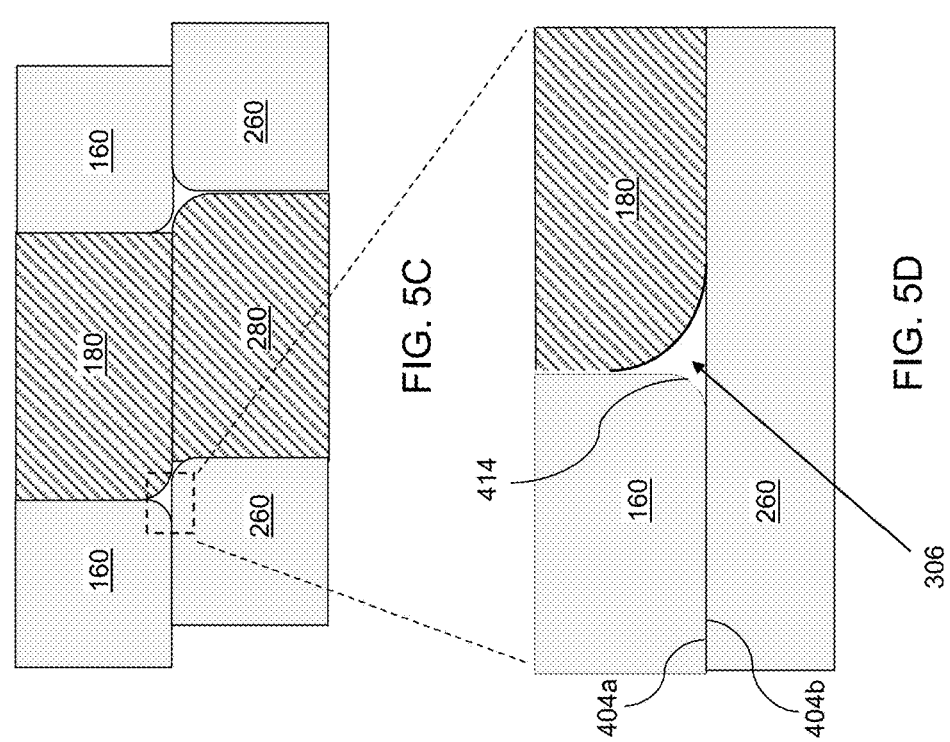
FIG. 5C
FIG. 5D
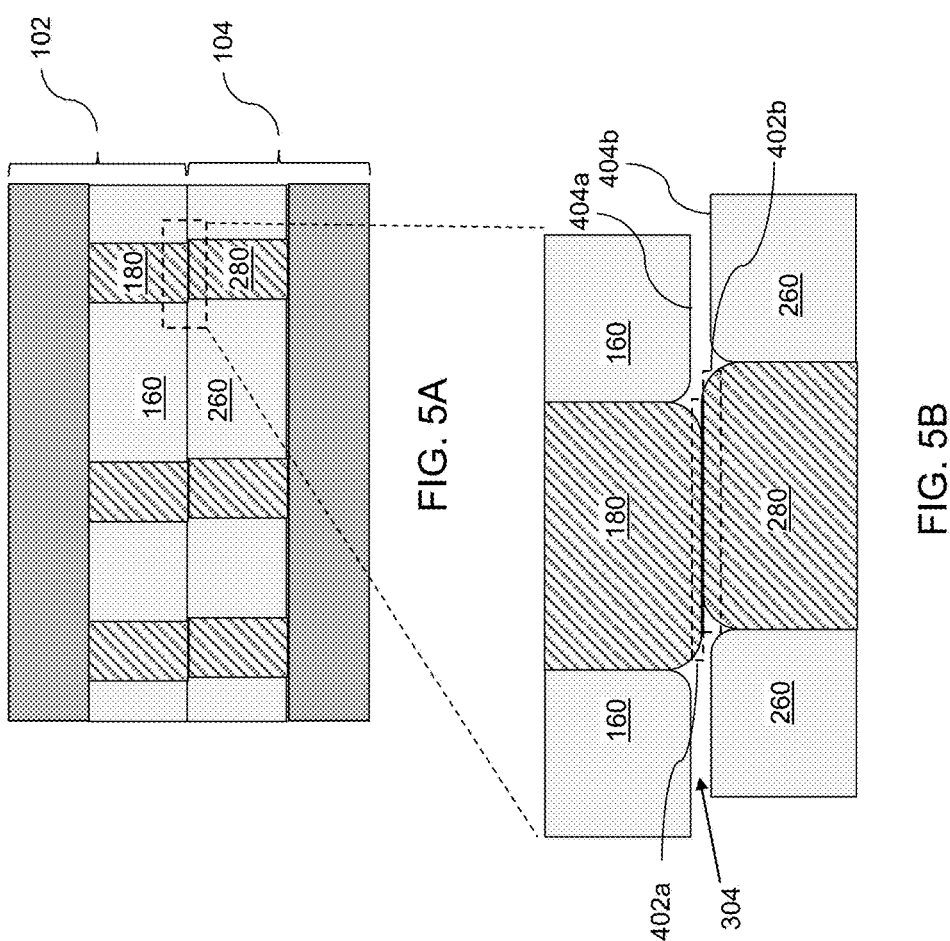
FIG. 5A
FIG. 5B

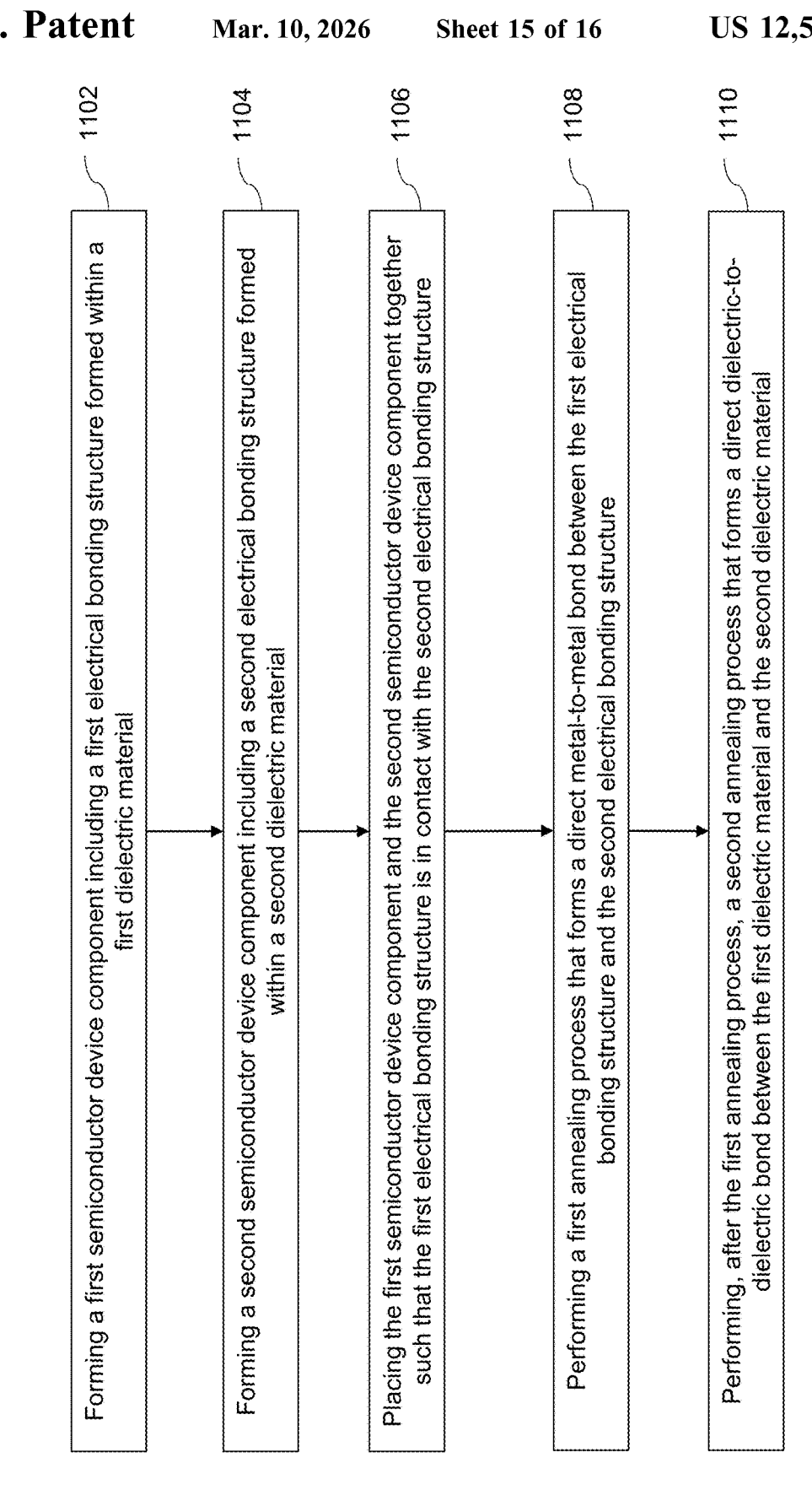

1102 — Forming a first semiconductor device component including a first electrical bonding structure formed within a first dielectric material 1104 — Forming a second semiconductor device component including a second electrical bonding structure formed within a second dielectric material 1106 — Placing the first semiconductor device component and the second semiconductor device component together such that the first electrical bonding structure is in contact with the second electrical bonding structure 1108 — Performing a first annealing process that forms a direct metal-to-metal bond between the first electrical bonding structure and the second electrical bonding structure 1110 — Performing, after the first annealing process, a second annealing process that forms a direct dielectric-to-dielectric bond between the first dielectric material and the second dielectric material

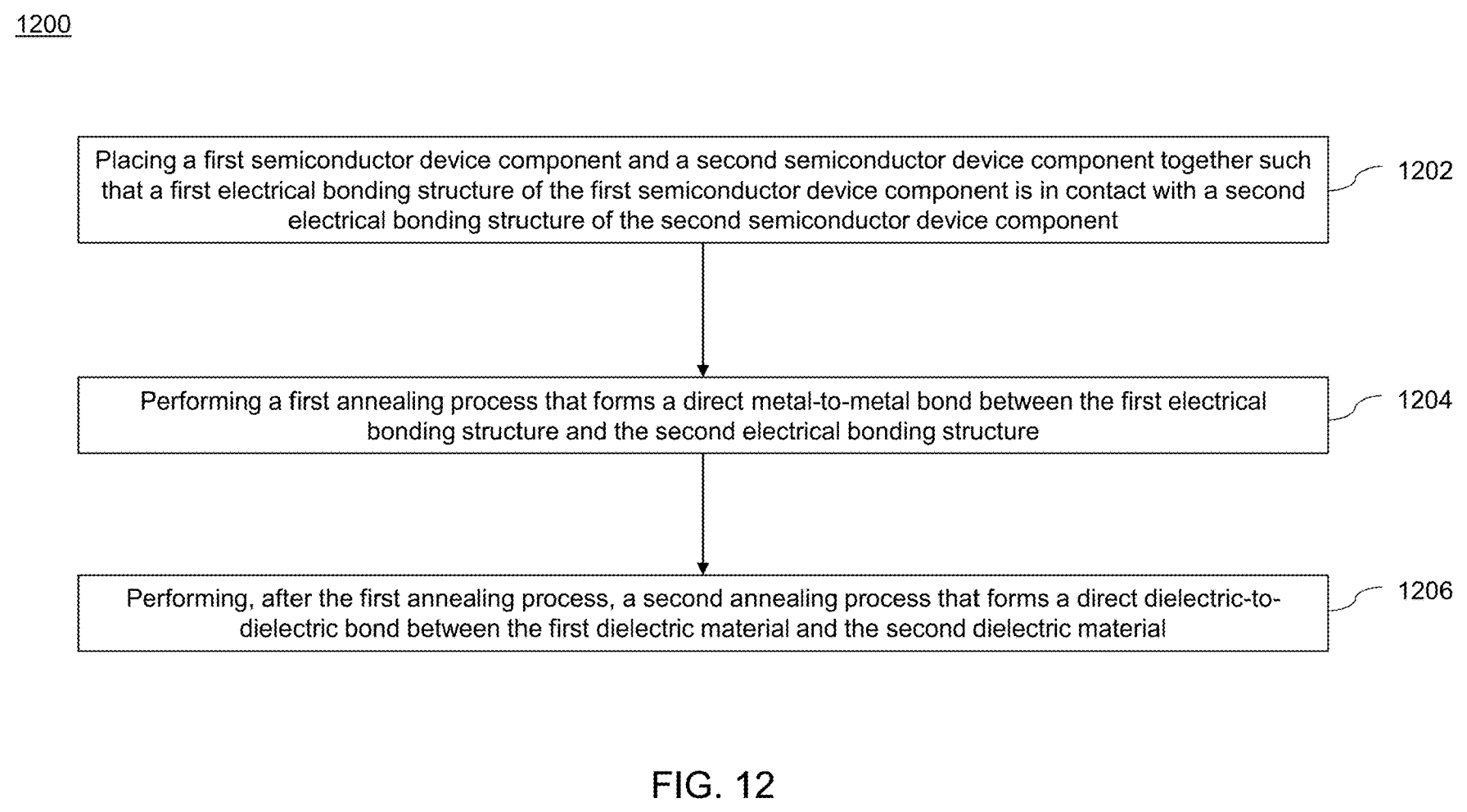

1200

1202

Placing a first semiconductor device component and a second semiconductor device component together such that a first electrical bonding structure of the first semiconductor device component is in contact with a second electrical bonding structure of the second semiconductor device component

1204

Performing a first annealing process that forms a direct metal-to-metal bond between the first electrical bonding structure and the second electrical bonding structure

1206

Performing, after the first annealing process, a second annealing process that forms a direct dielectric-to-dielectric bond between the first dielectric material and the second dielectric material

FIG. 12

BONDING STRUCTURES FOR SEMICONDUCTOR DEVICES AND METHODS OF FORMING THE SAME

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers over a semiconductor substrate, and patterning the various material layers using lithography and etching to form circuit components and elements thereon. Dozens or hundreds of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example.

As semiconductor packages have become more complex, package sizes have tended to become larger to accommodate greater numbers of integrated circuits and/or dies per package. These larger and more complex semiconductor packages have created challenges in making effective and reliable interconnections among various components of the semiconductor package. As such, there is an ongoing need for improvements to semiconductor package designs with an emphasis on reducing interconnect lengths to thereby reduce ohmic loss, heat generation, and signal delay. There is also an ongoing need for improvement in die-to-die bonding structures and methods.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view of a configuration of a first semiconductor die and a second semiconductor die prior to formation of die-to-die bonds between the first semiconductor die and the second semiconductor die, according to various embodiments.

FIG. 3B is an enlarged vertical cross-sectional view of a portion of the first semiconductor die and the second semiconductor die of FIG. 3A, according to various embodiments.

FIG. 3C is a vertical cross-sectional view of a configuration of the first semiconductor die and the second semiconductor die after formation of die-to-die bonds between the first semiconductor die and the second semiconductor die, according to various embodiments.

FIG. 3D is an enlarged vertical cross-sectional view of a portion of the first semiconductor die and the second semiconductor die of FIG. 3C showing details of the die-to-die bonds, according to various embodiments.

FIG. 4A is a vertical cross-sectional view of a further configuration of a first semiconductor die and a second semiconductor die prior to formation of die-to-die bonds between the first semiconductor die and the second semiconductor die, according to various embodiments.

FIG. 4B is an enlarged vertical cross-sectional view of a portion of the first semiconductor die and the second semiconductor die of FIG. 4A, according to various embodiments.

FIG. 4C is a vertical cross-sectional view of a configuration of the first semiconductor die and the second semiconductor die after formation of die-to-die bonds between the first semiconductor die and the second semiconductor die, according to various embodiments.

FIG. 4D is an enlarged vertical cross-sectional view of a portion of the first semiconductor die and the second semiconductor die of FIG. 4C showing details of the die-to-die bonds, according to various embodiments.

FIG. 5A is a vertical cross-sectional view of a further configuration of a first semiconductor die and a second semiconductor die prior to formation of die-to-die bonds between the first semiconductor die and the second semiconductor die, according to various embodiments.

FIG. 5B is an enlarged vertical cross-sectional view of a portion of the first semiconductor die and the second semiconductor die of FIG. 5A, according to various embodiments.

FIG. 5C is a vertical cross-sectional view of a configuration of the first semiconductor die and the second semiconductor die after formation of die-to-die bonds between the first semiconductor die and the second semiconductor die, according to various embodiments.

FIG. 5D is an enlarged vertical cross-sectional view of a portion of the first semiconductor die and the second semiconductor die of FIG. 5C showing details of the die-to-die bonds, according to various embodiments.

FIG. 11 is a flowchart illustrating operations of a method of forming a hybrid bond between a first semiconductor device component and a second semiconductor device component, according to various embodiments.

FIG. 12 is a flowchart illustrating operations of a further method of forming a hybrid bond between a first semiconductor device component and a second semiconductor device component, according to various embodiments.

DETAILED DESCRIPTION

Figure 1A:
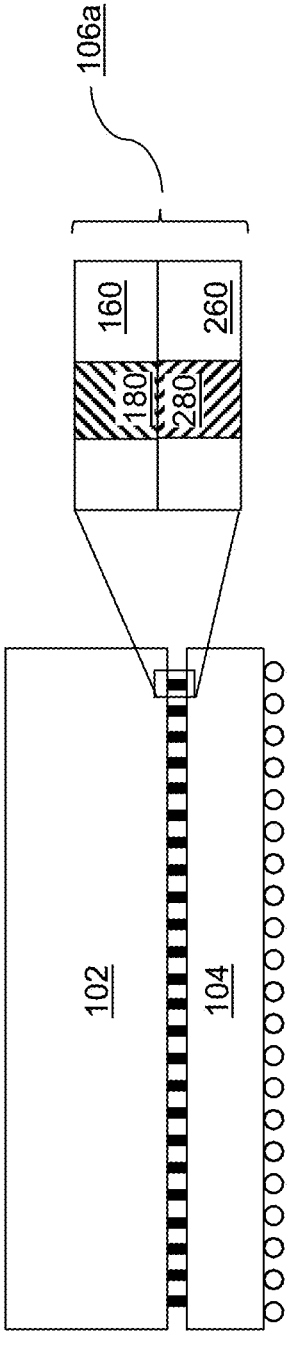
FIG. 1A is a vertical cross-sectional view of a chip assembly structure including a first semiconductor die and a second semiconductor die illustrating a first bonding configuration, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide sufficient heat dissipation from the semiconductor package. In some instances, the semiconductor package may include a package lid that may include a thermally-conductive material (e.g., a metal or metal alloy, such as copper). The package lid may be located over the IC dies. Heat from the IC dies may be transferred from the upper surfaces of the IC dies into the package lid and may be ultimately dissipated to the ambient environment. The heat may optionally be dissipated through a heat sink that may be attached to or may be integrally formed with the lid or through other components of the semiconductor package. An increase to the complexity of semiconductor package devices may give rise to challenges related to the need to reduce ohmic loss to thereby reduce heat generation and signal propagation delay. To mitigate such issues, new designs are desired to reduce interconnect lengths by increasing package integration. There is also an ongoing need for improvement in die-to-die bonding structures and methods.

Various embodiment methods of forming hybrid bonds between a first semiconductor device component and a second semiconductor device component are disclosed herein and may provide advantages by forming metal-metal bonds in a first process and by forming dielectric-to-dielectric bonds in a second process. In this regard, a first bonding structure and a second bonding structure may protrude from surfaces of respective first and second surrounding dielectric materials such that, when placed together, the first bonding structure and the second bonding structure are in contact with one another while leaving a gap between surfaces of the first and second surrounding dielectric materials. The disclosed embodiment methods may be in contrast to alternative methods in which the dielectric-to-dielectric bonds are formed before the metal-to-metal bonds. In such alternative methods the first and second bonding structures may be recessed with respect to surfaces of the first and second dielectric materials and precise control of a recess depth is desired to achieve good quality metal-to-metal bonds. Disclosed embodiment methods may provide greater manufacturing flexibility because precise control of a size of a protruding portion of first and second bonding structures is not essential due to the fact that the first and second bonding structure may deform during one or more annealing processes to overcome process variations in the size of the protruding portions. Various embodiments disclosed herein may also be advantageous by providing dielectric materials that may expand and/or flow into voids to thereby reduce or mitigate void formation.

An embodiment method of forming a hybrid bond between a first semiconductor device component and a second semiconductor device component may include forming the first semiconductor device component including a first electrical bonding structure formed within a first dielectric material; forming the second semiconductor device component including a second electrical bonding structure formed within a second dielectric material; placing the first semiconductor device component and the second semiconductor device component together such that the first electrical bonding structure is in contact with the second electrical bonding structure; performing a first annealing process that forms a direct metal-to-metal bond between the first electrical bonding structure and the second electrical bonding structure; and performing, after the first annealing process, a second annealing process that forms a direct dielectric-to-dielectric bond between the first dielectric material and the second dielectric material.

A further embodiment method of forming a hybrid bond between a first semiconductor device component and a second semiconductor device component may include placing the first semiconductor device component and the second semiconductor device component together such that a first electrical bonding structure of the first semiconductor device component is in contact with a second electrical bonding structure of the second semiconductor device component; performing a first annealing process that forms a direct metal-to-metal bond between the first electrical bonding structure and the second electrical bonding structure; and performing, after the first annealing process, a second annealing process that forms a direct dielectric-to-dielectric bond between the first dielectric material and the second dielectric material. The method may further include forming first electrical bonding structure that protrudes from a first dielectric material of the first semiconductor device component and forming the second electrical bonding structure that protrudes from a second dielectric material of the second semiconductor device component such that a gap is formed between a first surface of the first dielectric material and a second surface of the second dielectric material prior to the first and second annealing processes.

According to a further embodiment, a semiconductor device structure may include a first semiconductor device component including a first electrical bonding structure formed within a first dielectric material and a second semiconductor device component including a second electrical bonding structure formed within a second dielectric material. A direct metal-to-metal bond may be formed between the first electrical bonding structure and the second electrical bonding structure and a direct dielectric-to-dielectric bond may be formed between the first dielectric material and the second dielectric material. The first electrical bonding structure may include a first metal having a first metal coefficient of thermal expansion that is less than a first dielectric coefficient of thermal expansion of the first dielectric material. Similarly, the second electrical bonding structure may include a second metal having a second metal coefficient of thermal expansion that is less than a second dielectric coefficient of thermal expansion of the second dielectric material.

Various embodiment structures and methods disclosed herein may be used to form a chip assembly structure in which various circuits (e.g., a memory array and a peripheral circuit controlling operation of the memory array) may be implemented in different semiconductor dies. Embodiment semiconductor dies may be formed to have certain components that may be implemented in a front-end-of-line (FEOL) process that generates circuit elements (e.g., CMOS logic circuits) in or on a semiconductor substrate in addition to other circuit components (e.g., electrical interconnect structures formed with dielectric layers) formed in a back-end-of-line (BEOL) process.

As used herein, a "back-end-of-line" component or a "BEOL" component refers to any component that is formed at a contact level or at a metal interconnect level. A "metal interconnect level" refers to a level through which a metal interconnect structure, such as a metal line or a metal via structure, vertically extends. As used herein, a "front-end-of-line" component or an "FEOL" component refers to any component that is formed prior to formation of any contact level structure, if followed by formation of contact level structures, or without formation of any contact level structure or any metal interconnect structure (i.e., not followed by formation of any contact level structure or any metal interconnect structure).

In general, FEOL components refer to semiconductor device components that may be formed during a CMOS manufacturing process prior to formation of any contact via structure on nodes of field effect transistors, and BEOL components refer to semiconductor device components that may be formed during a CMOS manufacturing process during, or after, the earliest contact via formation process that forms contact via structures on nodes of field effect transistors. In embodiments in which any unconventional manufacturing steps are integrated into a CMOS manufacturing process, a component formed prior to formation of any contact via structure on nodes of field effect transistors may be referred to as an FEOL component, and a component formed during, or after, the earliest contact via formation process that forms contact via structures on nodes of field effect transistors may be referred to as a BEOL component.

Generally, an FEOL component may be formed within a semiconductor substrate, directly on a semiconductor substrate, or indirectly on a semiconductor substrate without any intervening metal interconnect structure between the semiconductor substrate and the component. Examples of the FEOL components include planar field effect transistors using a portion of the semiconductor substrate as a portion of a channel, fin field effect transistors (FinFET), gate-all-around field effect transistors, and any device component that includes a portion of a semiconductor substrate that has a lateral extent greater than the lateral extent of the respective device component. Typically, for each FEOL component, no metal interconnect structure vertically extends from a first horizontal plane including a top surface of the FEOL component to a second horizontal plane including a bottom surface of the FEOL component, or the FEOL component contacts, or is laterally surrounded by, a semiconductor material layer having a greater lateral extent than the FEOL component.

Examples of the BEOL components may include any dielectric material layer embedding a metal via structure or embedding a metal line structure, any metal interconnect structure, memory cells formed without using any portion of a semiconductor substrate, selector cells formed without using any portion of a semiconductor substrate, thin film transistors formed without using any portion of a semiconductor substrate (but may include patterned semiconductor material portions having a lateral extent that does not exceed the lateral extent of an individual thin film transistor or a cluster of merged thin film transistors), and bonding pads. Typically, for each BEOL component, at least one metal interconnect structure vertically extends from a first horizontal plane including a top surface of the BEOL component to a second horizontal plane including a bottom surface of the BEOL component, and the BEOL component does not contact, and is not laterally surrounded by, a semiconductor material layer having a greater lateral extent than the BEOL component.

In some embodiments, a chip assembly structure may include a semiconductor die stack that includes two or more double-sided semiconductor dies, each having a central portion (formed in a FEOL process) disposed between a front-side interconnect structure and a back side interconnect structure (formed in respective BEOL processes). For example, a die stack may include a first double-sided semiconductor die and a second double-sided semiconductor die. The first semiconductor die may include a first front-side interconnect structure and a first back-side interconnect structure, and the second semiconductor die may include a second front-side interconnect structure and a second back-side interconnect structure. The first semiconductor die and the second semiconductor die may be electrically connected to one another by electrically connecting the first back-side interconnect structure of the first semiconductor die to the second front-side interconnect structure of the second semiconductor die. In other embodiments, a chip assembly structure may include a semiconductor die stack that includes two or more single-sided dies having a back-side FEOL portion and a front-side BEOL portion. The back-side FEOL portion may include electrical contact structures formed as through-substrate vias and the front-side BEOL portion may include interconnect structures formed in a dielectric material.

The first semiconductor die 102 and the second semiconductor die 104 may be integrated into a chip assembly structure using a die-to-die connection, which may be implemented using a hybrid bonding process. The hybrid bonding process may generate direct metal-to-metal bonds between first electrical bonding structures of the first back-side interconnect structure and second electrical bonding structures of the second front-side interconnect structure. The hybrid bonding process may further generate direct dielectric-to-dielectric bonds between a first dielectric layer of the first back-side interconnect structure and a second dielectric layer of the second front-side interconnect structure. Various other bonding structures may be used to form the die-to-die connection, as described in greater detail below.

Each of the semiconductor dies in a chip stack may include circuit components configured to provide respective functionality (e.g., logic, memory, image processing, power delivery, analog circuits, etc.). Since different functionality may be provided by different semiconductor dies, a set of processing steps that may be used to manufacture a first semiconductor die (e.g., a memory die) and a set of processing steps that may be used to manufacture a second semiconductor die (e.g., a logic die) may be selected independently. As such, the performance of the first semiconductor die may be optimized without regard to how the second semiconductor die may be optimized and/or without regard to how the optimization of the first semiconductor die may negatively impact the second semiconductor die or vice versa. For example, a memory die may be optimized with a focus on the density of the memory cells, and a logic die may be optimized with a focus on the device speed, reduction of the process variability, and reliability of semiconductor devices during operation (including, but not limited to, reliability of the device with respect to power supply voltage variation).

Separate manufacturing processes and optimizations of the various semiconductor dies in a semiconductor die stack may allow a chip assembly structure to be produced at lower cost and with improved performance relative to semiconductor devices manufactured using other methods. In some embodiments, a standard layout of electrical bonding structures within front-side interconnect structures and back-side interconnect structures of different semiconductor dies may allow a wide variety of different types of semiconductor dies to be electrically connected to one another to form a chip assembly structure.

Figure 1B:
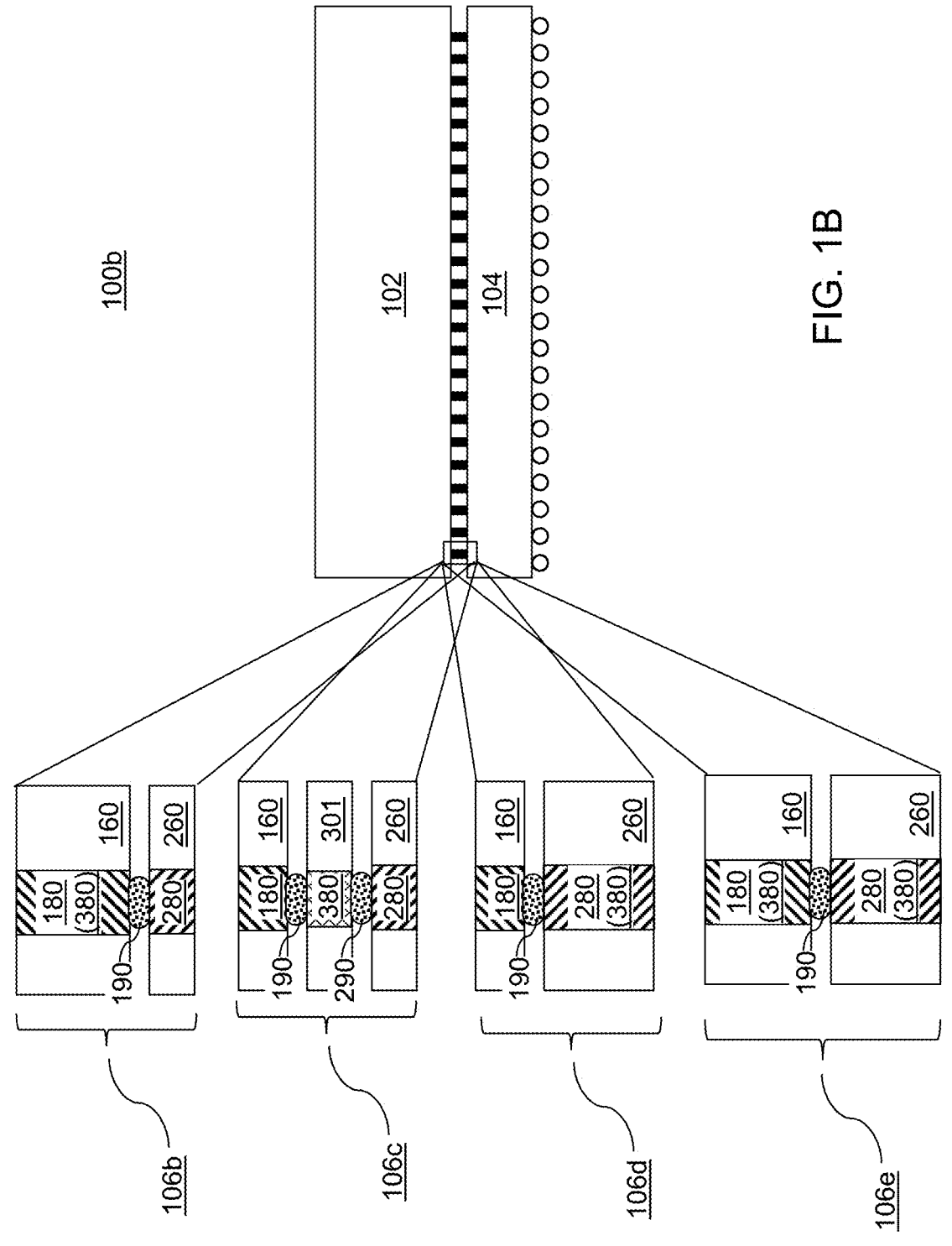
FIG. 1B is a vertical cross-sectional view of a chip assembly structure including a first semiconductor die and a second semiconductor die illustrating further bonding configurations, according to various embodiments.

FIG. 1A is a vertical cross-sectional view of a first chip assembly structure 100a including a first semiconductor die 102 and a second semiconductor die 104 illustrating a first bonding configuration 106a, and FIG. 1B is a vertical cross-sectional view of a further chip assembly structure 100b including the first semiconductor die 102 and the second semiconductor die 104 and illustrating further bonding configurations (106b, 106c, 106d, 106e), according to various embodiments. The first semiconductor die 102 may be configured to provide a certain functionality (e.g., memory, logic, etc.). The second semiconductor die 104 may be configured as a control-circuit-containing die, which may include a control circuit. The control circuit may include field effect transistors which are configured to control operation of the first semiconductor die 102. Each of the first semiconductor die 102 and the second semiconductor die 104 may be configured as a double-sided semiconductor die or as a single-sided die.

Figure 2:
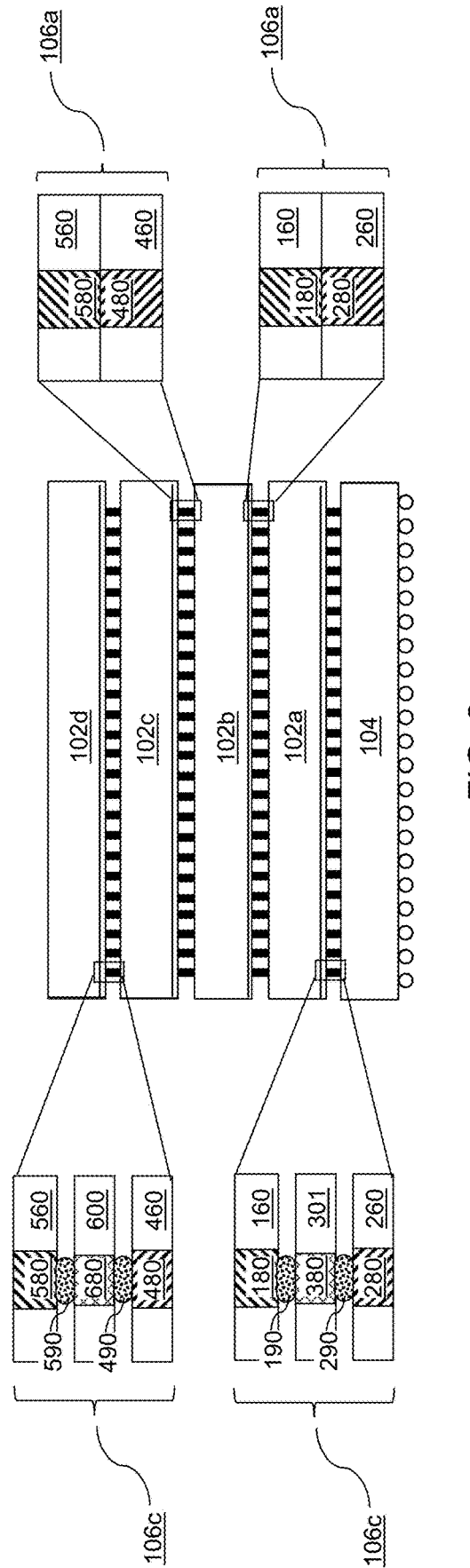
FIG. 2 is a vertical cross-sectional view of a chip assembly structure including five semiconductor dies, according to various embodiments.

The example embodiments described below with reference to FIGS. 1 and 2 are merely to illustrate various ways of bonding two structures together. These examples relate to bonding of a first semiconductor die 102 to a second semiconductor die 104. The disclosed embodiments, however, are not limited to bonding between semiconductor dies and may include bonding between any components of a semiconductor package structure such as memory-on-logic bonding, logic-on-logic bonding, bonding between logic and bridge dies, bonding between dies and wafers, wafer-to-wafer bonding, etc. The first semiconductor die 102 may be electrically connected to the second semiconductor die 104 using various types of die-to-die bonding, as indicated by the various bonding configurations (106a, 106b, 106c, 106d, 106e) shown in FIGS. 1A and 1B. In an example embodiment, the first semiconductor die 102 may include first electrical bonding structures 180 and the second semiconductor die 104 may include second electrical bonding structures 280. In an embodiment in which the first semiconductor die 102 is configured as a memory die, at least a subset of the first electrical bonding structures 180 may be electrically connected to metal interconnect structures in the memory die. As shown in FIG. 1A, the first electrical bonding structures 180 may be laterally surrounded by a first bonding-level dielectric layer 160, which may include a dielectric material that may provide dielectric-to-dielectric bonding (such as silicon oxide) or may include a passivation dielectric material (such as silicon nitride or silicon carbide nitride). Similarly, the second electrical bonding structures 280 may be embedded within a second bonding-level dielectric layer 260.

According to an embodiment, die-to-die bonding between the first semiconductor die 102 and the second semiconductor die 104 may be implemented using metal-to-metal bonding (e.g., see bonding configuration 106a in FIG. 1A) or through-substrate-via-mediated bonding (e.g., see bonding configurations 106b, 106c, 106d, and 106e in FIG. 1B). As used herein, "metal-to-metal bonding" refers to a bonding method and a bonded structure in which bonded structures are formed by direct contact between a first metal surface (e.g., first electrical bonding structure 180 in bonding configuration 106a) and a second metal surface (e.g., second electrical bonding structure 280 in bonding configuration 106a) and interdiffusion of metal atoms across a bonding interface between the first metal surface and the second metal surface. An exemplary metal-to-metal bonding is copper-to-copper bonding. In embodiments in which the die-to-die bonding uses metal-to-metal bonding, the first electrical bonding structures 180 (e.g., formed as first copper bonding pads) may be directly bonded to the second electrical bonding structures 280 (e.g., formed as second copper bonding pads).

In one embodiment, dielectric bonding between mating pairs of dielectric material layers (160, 260) may be used in conjunction with metal-to-metal bonding. This type of bonding (i.e., having metal-to-metal bonding and dielectric-to-dielectric bonding) may be herein referred to as hybrid bonding. In embodiments in which hybrid bonding is used (e.g., see bonding configuration 106a in FIG. 1A), the first bonding-level dielectric layer 160 may be bonded to the second bonding-level dielectric layer 260 by dielectric-to-dielectric bonding such as silicon oxide-to-silicon oxide bonding.

As used herein, "through-substrate-via-mediated bonding" refers to a bonding method or a bonding structure in which an array of through-substrate via (TSV) structures 380 (e.g., see bonding configurations 106b, 106c, 106d, and 106e in FIG. 1B), vertically extending through an embedding matrix material (160 and/or 260), is used to provide bonding between the first semiconductor die 102 and the second semiconductor die 104. In a first example embodiment, as shown in bonding configuration 106b of FIG. 1B, the array of TSV structures 380 may include the first electrical bonding structures 180. In other words, the first electrical bonding structures 180 may be formed as the array of TSV structures 380. In this embodiment, an array of solder material portions 190 may be used to provide bonding between the first electrical bonding structures 180 (which are the TSV structures 380) and the second electrical bonding structures 280. In a second example embodiment, as shown in bonding configuration 106c of FIG. 1B, a substrate 301 including an array of TSV structures 380 may be provided. A first array of solder material portions 190 may be used to attach the first electrical bonding structures 180 to the array of TSV structures 380, and a second array of solder material portions 290 may be used to attach the second electrical bonding structures 280 to the array of TSV structures 380.

In a third example embodiment, as shown in bonding configuration 106d in FIG. 1B, the array of TSV structures 380 may include the second electrical bonding structures 280. In other words, the second electrical bonding structures 280 may be formed as the array of TSV structures 380. In this embodiment, an array of solder material portions 190 may be used to provide bonding between the first electrical bonding structures 180 and the second electrical bonding structures 280 (which are the TSV structures 380). In a fourth example embodiment, as shown in bonding configuration 106d in FIG. 1B, each of the first electrical bonding structures 180 and the second electrical bonding structures 280 may be formed as respective arrays of TSV structures 380. In this embodiment, an array of solder material portions 190 may be used to provide bonding between the first electrical bonding structures 180 (which are formed as TSV structures 380) and the second electrical bonding structures 280 (which are also formed as TSV structures 380).

In embodiments in which the first semiconductor die 102 is configured as a memory die and the second semiconductor die 104 is configured as a control control-circuit-containing die, electrical nodes of the memory die may be connected to electrical nodes of the control-circuit-containing die through metal-to-metal bonding between mating pairs of electrical bonding structures (180, 280), as shown in bonding configuration 106a in FIG. 1A, or through an array of TSV structures 380, as shown in FIG. 1B in bonding configurations 106b, 106c, 106d, and 106e.

The memory die (e.g., first semiconductor die 102) may include electrical connections for all bit lines and for all word lines within one or more memory arrays within the memory die (e.g., first semiconductor die 102), and the control-circuit-containing die (e.g., second semiconductor die 104) may include the entirety of the control circuit for the memory die. For example, the control-circuit-containing die may include all peripheral circuits including, but not limited to, bit line drivers, word line drivers, sense amplifiers, design-for-testability (DFT) circuits, scan chain circuits, built-in-self-test (BIST) circuits, error correction circuits (ECCs), phase-locked loop (PLL) circuits, electrically-programmable fuse (e-Fuse) circuits, input/output (IO) circuits, voltage generator (power supply) circuits, etc.

Generally, the front side (i.e., the bottom side in the embodiment of FIGS. 1A and 1B) or the backside (i.e., the top side in the embodiment of FIGS. 1A and 1B) of the first semiconductor die 102 may be used to form the first electrical bonding structures 180. Likewise, the front side (i.e., the bottom side) or the backside (i.e., the top side) of the second semiconductor die 104 may be used to form the second electrical bonding structures 280. As such, front-to-front bonding, front-to-back bonding, back-to-front bonding, or back-to-back bonding may be used to bond the second semiconductor die 104 to the first semiconductor die 102. Further, in some embodiments, at least one additional structure may be integrated into the first semiconductor die 102 in addition to the memory die, which may include at least one BEOL structure such as a memory die, logic die, etc.

FIG. 2 is a vertical cross-sectional view of a chip assembly structure 200 including five semiconductor dies (102a, 102b, 102c, 102d, 104), according to various embodiments. As shown, the chip assembly structure 200 may include four first semiconductor dies (102a, 102b, 102c, 102d) that may provide a first functionality and a second semiconductor die 104 that may provide a second functionality. For example, the four first semiconductor dies (102a, 102b, 102c, 102d) may provide memory or logic functionality. For example, according to some embodiments, each of the four first semiconductor dies (102a, 102b, 102c, 102d) may be configured to provide different levels of memory (e.g., level-1 cache, level-2 cache, etc.). As in the embodiments 100a and 100b described above with reference to FIGS. 1A and 1B, respectively, the second semiconductor die 104 may provide control circuits that may be configured to control the four first semiconductor dies (102a, 102b, 102c, 102d).

Each of the first semiconductor dies (102a, 102b, 102c, 102d) in FIG. 2 may be vertically stacked and may be interconnected to one another. In some embodiments, each of the first semiconductor dies (102a, 102b, 102c, 102d) may include a respective memory array, such as a two-dimensional memory array or a three-dimensional memory array formed within a respective set of dielectric material layers. The bottommost first semiconductor die 102a may include die-to-die connection interconnect structures (including the first electrical bonding structures 180 that are embedded within first bonding-level dielectric layers 160). The first electrical bonding structures 180 may be bonded to the second electrical bonding structures 280 (embedded within a second bonding-level dielectric layer 260) in any bonding configuration (106a, 106b, 106c, 106d, 106e) described above with reference to FIG. 1. For example, the first electrical bonding structures 180 may be bonded to the second electrical bonding structures 280 in the bonding configuration 106a as shown in the lower right of FIG. 2, or in the bonding configuration 106c, as shown in the lower left portion of FIG. 2. In this way, each vertically neighboring pair of first semiconductor dies (102a, 102b, 102c, 102d) may be interconnected to one another through additional die-to-die connection structures.

For example, a first one of the first semiconductor dies (102a, 102b, 102c, 102d) within each vertically-neighboring pair of first semiconductor dies (102a, 102b, 102c, 102d) may include third bonding structures 480 that are embedded in a third bonding-level dielectric layer 460, and a second one of the first semiconductor dies (102a, 102b, 102c, 102d) within each vertically-neighboring pair of the first semiconductor dies (102a, 102b, 102c, 102d) may include fourth bonding structures 580 that are embedded in a fourth bonding-level dielectric layer 560. The third bonding structures 480 may be bonded to the fourth bonding structures 580 through metal-to-metal bonding, as indicated by bonding configuration 106a (e.g., as shown in the upper right of FIG. 2), or through-substrate-via-mediated bonding, according to bonding configuration 106c (e.g., as shown in the upper left of FIG. 2). According to bonding configuration 106a, the third bonding structures 480 may be bonded to the fourth bonding structures 580 through metal-to-metal bonding, and the third bonding-level dielectric layer 460 may be bonded to the fourth bonding-level dielectric layer 560 through dielectric-to-dielectric bonding. In one embodiment, one, a plurality, or each, of the vertically neighboring pairs of first semiconductor dies (102a, 102b, 102c, 102d) may be bonded via hybrid bonding (i.e., metal-to-metal and dielectric-to-dielectric bonding).

Alternatively, or additionally, one, a plurality, or each, of the vertically neighboring pairs of first semiconductor dies (102a, 102b, 102c, 102d) may be bonded via through-substate-via-mediated bonding according to bonding configurations (106b, 106c, 106d, 106e), as described above with reference to FIG. 1B. For example, a substrate 600 including an array of TSV structures 680 may be provided, a third array of solder material portions 490 may be used to attach the third bonding structures 480 to the array of TSV structures 680, and a fourth array of solder material portions 590 may be used to attach the fourth bonding structures 580 to the array of TSV structures 680, according to bonding configuration 106c shown in FIG. 2. In another illustrative example, the array of TSV structures 680 may include the third bonding structures 480 (not shown). In other words, the third bonding structures 480 may be formed as the array of TSV structures 680 (similar to bonding configuration 106d in FIG. 1B). In this embodiment, an array of solder material portions 490 may be used to provide bonding between the third bonding structures 480 (which are the TSV structures 680) and the fourth bonding structures 580.

In yet another illustrative example, the array of TSV structures 680 may include the fourth bonding structures 580 (not shown). In other words, the fourth bonding structures 580 may be formed as the array of TSV structures 680 (similar to bonding configuration 106b of FIG. 1B). In this embodiment, an array of solder material portions 490 may be used to provide bonding between the third bonding structures 480 and the fourth bonding structures 580 (which are the TSV structures 680). Lastly, as described above with reference to FIG. 1B, each of the third bonding structures 480 and the fourth bonding structures 580 may be formed as TSV structures (similar to bonding configuration 106e of FIG. 1).

FIG. 3A is a vertical cross-sectional view of a configuration of a first semiconductor die 102 and a second semiconductor die 104 prior to formation of die-to-die bonds between the first semiconductor die 102 and the second semiconductor die 104, according to various embodiments. As described above with reference to FIGS. 1 and 2, the first semiconductor die 102 may include first electrical bonding structures 180 and the second semiconductor die 104 may include second electrical bonding structures 280. The first electrical bonding structures 180 may be laterally surrounded by a first bonding-level dielectric layer 160 and the second electrical bonding structures 280 may be laterally surrounded by a second bonding-level dielectric layer 260. The first electrical bonding structures 180 and the second electrical bonding structures 280 may be formed of a conductive material such as Al, Cu, etc. Other suitable conductive materials are within the contemplated scope of disclosure. The first electrical bonding structures 180 and the second electrical bonding structures 280 may each be formed as bonding pads or as TSV structures. As such, a hybrid bonding process may be performed to bond the first semiconductor die 102 to the second semiconductor die 104 using any of the bonding configurations (106a, 106b, 106c, 106d, 106e) described with reference to FIGS. 1 and 2, above.

According to an example embodiment, the first semiconductor die 102 and the second semiconductor die 104 may be positioned relative to one another in a front-to-front bonding configuration, as shown in FIG. 3A. In this regard, each of the first semiconductor die 102 and the second semiconductor die 104 may include a semiconductor substrate 302 formed in a FEOL process. As such, each of the first electrical bonding structures 180 and the second electrical bonding structures 280 may be formed as TSV structures formed within the semiconductor substrate 302. The semiconductor substrate 302 may be a silicon substrate and the first electrical bonding structures 180 and the second electrical bonding structures 280 may be formed as copper TSV structures. As such, a hybrid bonding process may be performed to bond the first semiconductor die 102 and the second semiconductor die 104 according to the bonding configuration 106e, described above with reference to FIGS. 1 and 2, above, In an alternative embodiment (not shown) the first semiconductor die 102 and the second semiconductor die 104 may be positioned relative to one another in a back-to-back bonding configuration. As such, the first semiconductor die 102 and the second semiconductor die 104 may be positioned such that a BEOL structure (e.g., interconnect structures formed within dielectrics) of each of the first semiconductor die 102 and the second semiconductor die 104 may positioned proximate to one another (e.g., rather than a proximate positioning of the respective semiconductor substrates 302 as shown in FIG. 3A). In such a back-to-back bonding configuration (not shown) the first electrical bonding structure 180 and the second electrical bonding structure 280 may be formed as bonding pads that are electrically connected to the BEOL structure. As such, the first semiconductor die 102 and the second semiconductor die 104 may be bonded to one another according to the bonding configuration 106a, described above with reference to FIGS. 1 and 2. Various other bonding configurations may be formed (including front-to-back and back-to-front) between the first semiconductor die 102 and the second semiconductor die 104, as described above with reference to FIGS. 1 and 2.

FIG. 3B is an enlarged vertical cross-sectional view of a portion of the first semiconductor die 102 and the second semiconductor die 104 of FIG. 3A, according to various embodiments. As shown, each of the first electrical bonding structure 180 and the second electrical bonding structure 280 may be recessed relative to the first bonding-level dielectric layer 160 and the second bonding-level dielectric layer 260, respectively, such that a gap 304 may be formed between the first electrical bonding structure 180 and the second electrical bonding structure 280. In this configuration, the first bonding-level dielectric layer 160 and the second bonding-level dielectric layer 260 may be positioned to be in contact with one another while the first electrical bonding structure 180 and the second electrical bonding structure 280 are not in contact with one another. A first process may then be performed to cause a direct dielectric-to-dielectric bond to form between the first bonding-level dielectric layer 160 and the second bonding-level dielectric layer 260. A second process may then be performed to generate direct metal-to-metal bonds between the first electrical bonding structure 180 and the second electrical bonding structure 280. As shown, in FIG. 3B, the first electrical bonding structure 180 and the second electrical bonding structure 280 need not be perfectly aligned with one another.

In the first process, the assembly of the first semiconductor die 102 and the second semiconductor die 104 may be compressed at a first temperature to cause direct dielectric-to-dielectric bonding. In an example embodiment, the first bonding-level dielectric layer 160 and the second bonding-level dielectric layer 260 may be chosen to be silicon oxide and first electrical bonding structure 180 and the second electrical bonding structure 280 may be chosen to be copper. With such materials, the first process may be performed at a temperature between 25° C. and 400° C. under compression up to 200 MPa. After the first process, the first bonding-level dielectric layer 160 and the second bonding-level dielectric layer 260 may be bonded to one another while the first electrical bonding structure 180 and the second electrical bonding structure 280 remain unbonded.

In the second process, the first semiconductor die 102 and the second semiconductor die 104 may be annealed at an elevated temperature (e.g., between 25° C. and 400° C.) with or without external pressure (e.g., up to 200 MPa). The second process may further strengthen the bonds between the first bonding-level dielectric layer 160 and the second bonding-level dielectric layer 260 and may cause the first electrical bonding structure 180 and the second electrical bonding structure 280 to bond to one another through direct metal-to-metal bonding. An internal compressive stress may be generated between the first electrical bonding structure 180 and the second electrical bonding structure 280 due to thermal expansion. In this regard, the thermal expansion coefficient of the first electrical bonding structure 180 and the second electrical bonding structure 280 (e.g., copper ~17 ppm/° C.) may be larger than that of the first bonding-level dielectric layer 160 and the second bonding-level dielectric layer 260 (e.g., SiOx ~2-8 ppm/° C.). As such, the first electrical bonding structure 180 and the second electrical bonding structure 280 may expand to a greater extent than that of the first bonding-level dielectric layer 160 and the second bonding-level dielectric layer 260, which may cause the gap 304 to close such that the first electrical bonding structure 180 and the second electrical bonding structure 280 come into direct contact with one another. The greater thermal expansion of the first electrical bonding structure 180 and the second electrical bonding structure 280, relative to the first bonding-level dielectric layer 160 and the second bonding-level dielectric layer 260, may further generate compressive stresses between that first electrical bonding structure 180 and the second electrical bonding structure 280 that may promote direct metal-to-metal bonding along with thermal diffusion of metal atoms between the first electrical bonding structure 180 and the second electrical bonding structure 280.

The size of the gap 304 may be chosen for optimal die-to-die bonding. For example, in instances in which the gap 304 is too small, the relatively larger thermal expansion of the first electrical bonding structure 180 and the second electrical bonding structure 280 may generate tensile stresses within the first bonding-level dielectric layer 160 and the second bonding-level dielectric layer 260 that may cause damage (e.g., rupture, delamination, etc.) to the first bonding-level dielectric layer 160 and the second bonding-level dielectric layer 260. Similarly, in instances in which the gap 304 is too large, the first electrical bonding structure 180 and the second electrical bonding structure 280 may not expand sufficiently such that contact may be formed between the first electrical bonding structure 180 and the second electrical bonding structure 280. Further, even in instances in which the first electrical bonding structure 180 and the second electrical bonding structure 280 come into contact with one another, a gap 304 that is too large may not allow sufficient compressive stresses to form between the first electrical bonding structure 180 and the second electrical bonding structure 280 such that direct metal-to-metal bonding may occur. In general, the size of the gap 304 may be chosen as a function of bonding temperature, with higher bonding temperatures requiring larger gaps 304.

FIG. 3C is a vertical cross-sectional view of a configuration of the first semiconductor die 102 and the second semiconductor die 104 after formation of die-to-die bonds between the first semiconductor die 102 and the second semiconductor die 104, and FIG. 3D is an enlarged vertical cross-sectional view of a portion of the first semiconductor die 102 and the second semiconductor die 104 of FIG. 3C showing details of the die-to-die bonds, according to various embodiments. As shown in FIG. 3D, one or more voids 306 may form at interfaces between the first electrical bonding structure 180, the first bonding-level dielectric layer 160, and the second bonding-level dielectric layer 260. Similar voids (not shown) form between the second electrical bonding structure 280, the first bonding-level dielectric layer 160, and the second bonding-level dielectric layer 260.

A number and size of voids 306 may be reduced through careful preparation of surfaces of the first electrical bonding structure 180 and the second electrical bonding structure 280. For example, surfaces of the first electrical bonding structure 180 and the second electrical bonding structure 280 may be etched/cleaned and/or subjected to a planarization process (e.g., chemical mechanical planarization (CMP)) to generate flat smooth surfaces. However, as shown in FIGS. 3C and 3D, occurrences of rounded corners at edges of the first electrical bonding structure 180 and the second electrical bonding structure 280 may occur after a CMP process is performed. Such rounded corners may lead to voids 306 at edges of the first electrical bonding structure 180 and the second electrical bonding structure 280, as shown in FIG. 3D even in instances in which contacting surfaces between the first electrical bonding structure 180 and the second electrical bonding structure 280 are smooth and flat.

Figures 3E, 3F:
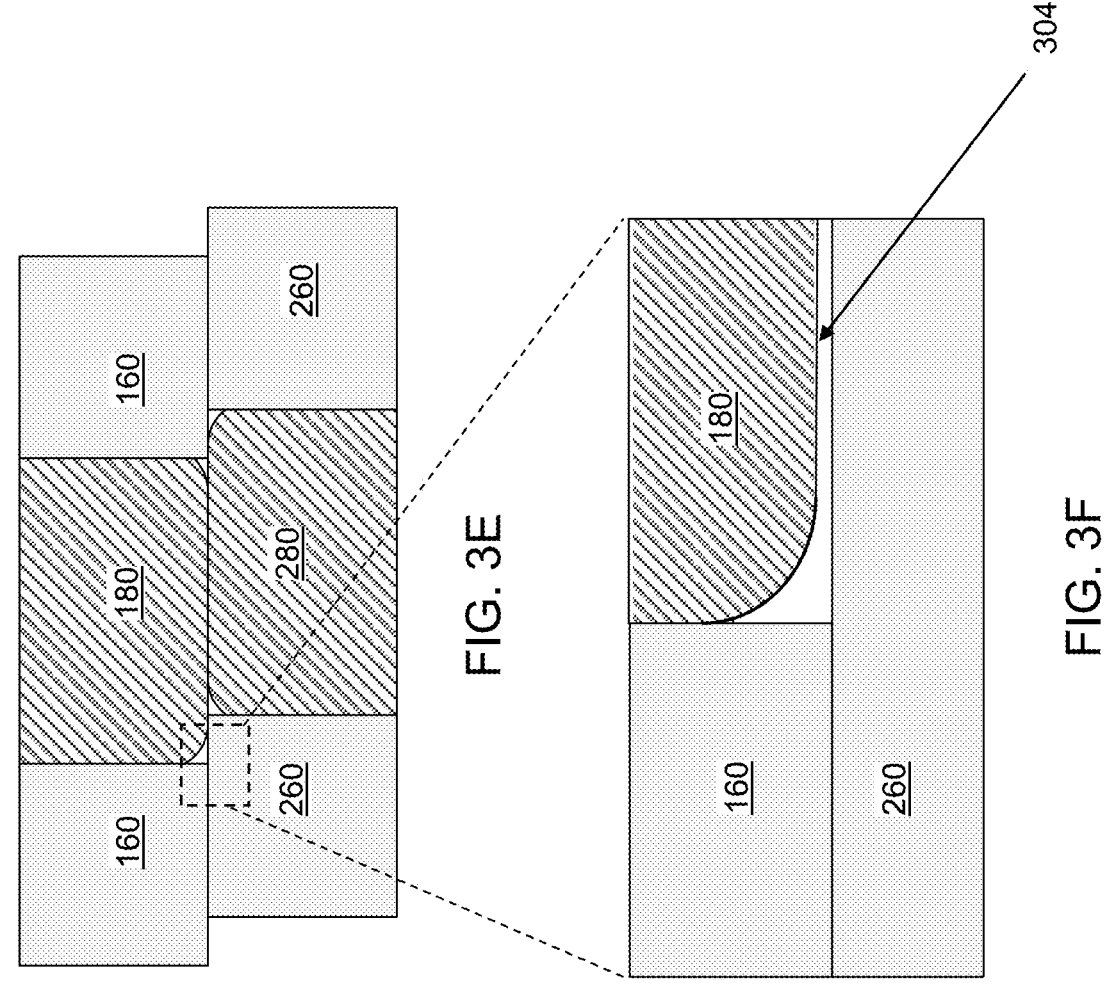
FIG. 3E is a vertical cross-sectional view of a further configuration of the first semiconductor die and the second semiconductor die after formation of die-to-die bonds between the first semiconductor die and the second semiconductor die, according to various embodiments.
FIG. 3F is an enlarged vertical cross-sectional view of a portion of the first semiconductor die and the second semiconductor die of FIG. 3E showing details of various interfaces, according to various embodiments.

FIG. 3E is a vertical cross-sectional view of a further configuration of the first semiconductor die 102 and the second semiconductor die 104 after formation of die-to-die bonds between the first semiconductor die 102 and the second semiconductor die 104, and FIG. 3F is an enlarged vertical cross-sectional view of a portion of the first semiconductor die 102 and the second semiconductor die 104 of FIG. 3E showing details of various interfaces, according to various embodiments. As shown in FIG. 3F, the gap 304 may persist after performance of the first process and the second process. As described above, even in instances in which the first bonding-level dielectric layer 160 and the second bonding-level dielectric layer 260 may become bonded through direct dielectric-to-dielectric bonds, the first electrical bonding structure 180 and the second electrical bonding structure 280 may remain unbonded in instances in which the initial size of the gap 304 is too large. In general, it may be challenging to generate a gap 304 having a precisely defined thickness because various processing steps (e.g., wet-clean (etching) and CMP) may lead to variations in thickness of the gap 304. Such variations may lead to decreased process yield, with some gaps 304 being too large and other gaps 304 being too small. Various disclosed embodiments, described in greater detail below, may improve process yield by mitigating situations in which the gap 304 is too large or too small.

FIG. 4A is a vertical cross-sectional view of a configuration of a first semiconductor die 102 and a second semiconductor die 104 prior to formation of die-to-die bonds between the first semiconductor die 102 and the second semiconductor die 104, and FIG. 4B is an enlarged vertical cross-sectional view of a portion of the first semiconductor die 102 and the second semiconductor die 104 of FIG. 4A, according to various embodiments. The first semiconductor die 102 may include first electrical bonding structures 180 and the second semiconductor die 104 may include second electrical bonding structures 280. The first electrical bonding structures 180 may be laterally surrounded by a first bonding-level dielectric layer 160 and the second electrical bonding structures 280 may be laterally surrounded by a second bonding-level dielectric layer 260. The first electrical bonding structures 180 and the second electrical bonding structures 280 may be formed of a conductive material such as Al, Cu, etc. Other suitable conductive materials may be within the contemplated scope of disclosure. The first bonding structures and the second electrical bonding structures 280 may each be formed as bonding pads or as TSV structures, as described in greater detail, above.

As shown in FIG. 4B, the first electrical bonding structure 180 may be formed within the first bonding-level dielectric layer 160 such that the first electrical bonding structure 180 includes a first portion 402a that protrudes from a first surface 404a of the first bonding-level dielectric layer 160. Similarly, the second electrical bonding structure 280 may be formed within the second bonding-level dielectric layer 260 such that the second electrical bonding structure 280 includes a second portion 402b that protrudes from a second surface 404b of the second bonding-level dielectric layer 260. Further, as shown in FIG. 4B, the first semiconductor die 102 and the second semiconductor die 104 may be placed together such that the first portion 402a of the first electrical bonding structure 180 is in contact with the second portion 402b of the second electrical bonding structure 280 such that a gap 304 is formed between the first surface 404a of the first bonding-level dielectric layer 160 and the second surface 404b of the second bonding-level dielectric layer 260. In this way, a first process may be performed to form metal-to-metal bonds between the first portion 402a of the first electrical bonding structure 180 and the second portion 402b of the second electrical bonding structure 280.

The first process may include performing a first annealing process to generate direct metal-to-metal bonds between the first electrical bonding structure 180 and the second electrical bonding structure 280. The first annealing process may be performed with or without applied compressive forces. In this regard, in some embodiments, a pressure may be applied to compress the first semiconductor die 102 and the second semiconductor die 104 toward one another. The applied compressive forces, which may be applied at an elevated temperature, may promote direct metal-to-metal bonding along with thermal diffusion of metal atoms between the first electrical bonding structure 180 and the second electrical bonding structure 280. The application of compressive forces may also act to reduce a size of the gap 304 between the first surface 404a of the first bonding-level dielectric layer 160 and the second surface 404b of the second bonding-level dielectric layer 260.

In this regard, the application of compressive forces during the first annealing process may cause deformation of one or both of the first portion 402a of the first electrical bonding structure 180 and the second portion 402b of the second electrical bonding structure 280 such that a size of the gap 304 may be reduced during the first annealing process. In instances in which the gap 304 is decreased sufficiently, the first surface 404a of the of the first bonding-level dielectric layer 160 and the second surface 404b of the second bonding-level dielectric layer 260 may come in contact and may form direct dielectric-to-dielectric bonds. The dielectric-to-dielectric bonds may be formed during the first annealing process or a separate second annealing process may be performed to generate the direct dielectric-to-dielectric bonds.

In addition to the above-described processes, the gap 304 may also be reduced due to thermal expansion. In this regard, the first electrical bonding structure 180 and the second electrical bonding structure 280 may each have a lower coefficient of thermal expansion than that of the respective first bonding-level dielectric layer 160 and the second bonding-level dielectric layer 260. As such, during an annealing process, the first bonding-level dielectric layer 160 and the second bonding-level dielectric layer 260 may expand to a greater extent than that of the respective first electrical bonding structure 180 and the second electrical bonding structure 280. As such, the gap 304 may be reduced or eliminated (i.e., closed) due to the relatively greater thermal expansion of the first bonding-level dielectric layer 160 and the second bonding-level dielectric layer 260 relative to that of the first electrical bonding structure 180 and the second electrical bonding structure 280.

According to an embodiment, the first electrical bonding structure 180 and the second electrical bonding structure 280 may be formed of a metal having a coefficient of thermal expansion that is in a range from 10 ppm/K to 20 ppm/K and the first bonding-level dielectric layer 160 and the second bonding-level dielectric layer 260 may be formed of a dielectric material having a coefficient of thermal expansion that is in a range from 30 ppm/K to 200 ppm/K (e.g., 40 ppm/K to 60 ppm/K). For example, the first electrical bonding structure 180 and the second electrical bonding structure 280 may be formed of copper or a copper alloy, and the first bonding-level dielectric layer 160 and the second bonding-level dielectric layer 260 may be formed of a polymer material such as polyimide, polybenzoxazole, polymethyl methacrylate, benzocyclobutene, etc. According to an embodiment, the first process may include annealing the structure at a temperature in a range from 200° C. to 400° C. (e.g., 300° C.) for 1 to 2 hours to form metal-to-metal bonds, and the second process may include annealing the structure at a temperature in a range from 250° C. to 400° C. for 1 to 3 hours. Further, a gap 304 having a thickness in a range from 5 nm to 50 nm may allow for suitable dielectric-to-dielectric bonds to be formed.

FIG. 4C is a vertical cross-sectional view of a configuration of the first semiconductor die 102 and the second semiconductor die 104 after formation of die-to-die bonds between the first semiconductor die 102 and the second semiconductor die 104, and FIG. 4D is an enlarged vertical cross-sectional view of a portion of the first semiconductor die 102 and the second semiconductor die 104 of FIG. 4C showing details of the die-to-die bonds, according to various embodiments. As shown, the gap 304 has been eliminated (i.e., closed) such that the first surface 404a of the first bonding-level dielectric layer 160 comes in contact with the second surface 404b of the second bonding-level dielectric layer 260.

As described above, the gap 304 may be eliminated due to various processes. For example, compressive forces may be applied that may cause deformation of the first electrical bonding structure 180 and the second electrical bonding structure 280 leading to reduction or elimination of the gap 304. Alternatively, or in addition to the application of compressive forces, the gap 304 may be closed due to a larger thermal expansion of the first bonding-level dielectric layer 160 and the second bonding-level dielectric layer 260 relative to a thermal expansion of the first electrical bonding structure 180 and the second electrical bonding structure 280. In addition to forming direct dielectric-to-dielectric bonds between the first surface 404a and the second surface 404b, one or both of the first bonding-level dielectric layer 160 and the second bonding-level dielectric layer 260 may deform to thereby (partially or completely) fill voids 306 (e.g., see FIG. 3D). In this regard, as shown in FIG. 4D, one or both of the first bonding-level dielectric layer 160 and the second bonding-level dielectric layer 260 may expand and/or flow into voids 306 to form a deformed region 406.

Figure 4F:
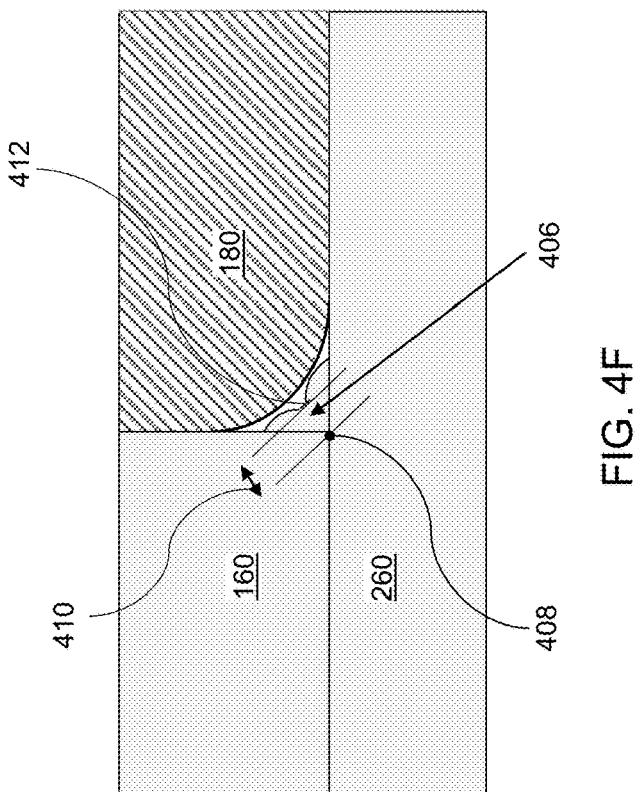
FIG. 4F is an enlarged vertical cross-sectional view of a portion of the first semiconductor die and the second semiconductor die of FIG. 4C after formation of a deformed region showing details of the deformed region, according to various embodiments.
Figure 4E:
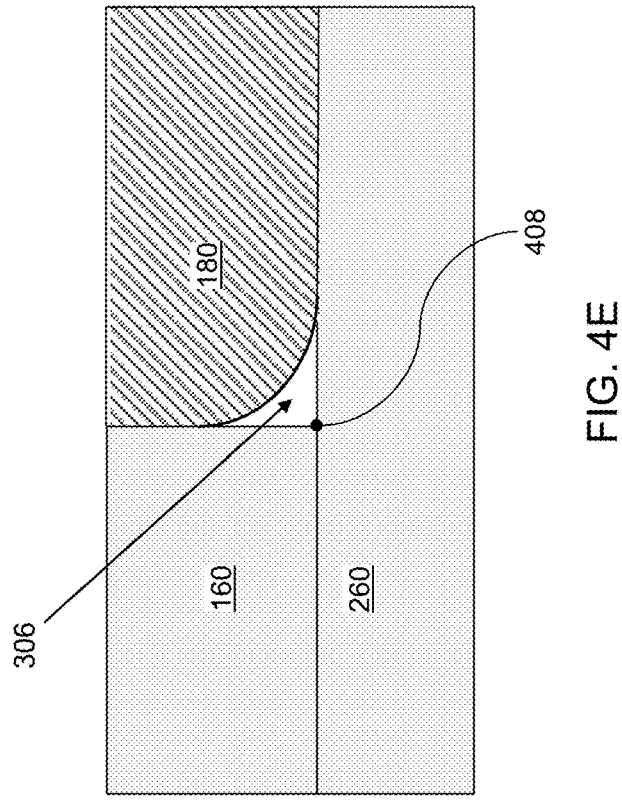
FIG. 4E is an enlarged vertical cross-sectional view of a portion of the first semiconductor die and the second semiconductor die of FIG. 4C after a gap between dielectric surfaces has been closed but prior to formation of a deformed region, according to various embodiments.

FIG. 4E is an enlarged vertical cross-sectional view of a portion of the first semiconductor die 102 and the second semiconductor die 104 after the gap 304 between the first surface 404a and the second surface 404b has been closed but prior to formation of the deformed region 406, and FIG. 4F is an enlarged vertical cross-sectional view of a portion of the first semiconductor die 102 and the second semiconductor die 104 after formation of the deformed region 406 showing details of the deformed region 406, according to various embodiments.

A spatial extent of the deformed region 406 may be quantified by considering a distance 410 from a reference point 408 to a surface of the deformed region 406. In this example embodiment, the reference point 408 may be taken to be a corner intersection point between a vertical surface of the first bonding-level dielectric layer 160 and a horizontal surface of the second bonding-level dielectric layer 260, as shown in FIGS. 4E and 4F. As shown in FIG. 4F, the distance 410 may be measured from the reference point 408 to a closest point 412 on a surface of the deformed region 406. In some example embodiments, the distance characterizing a size of the deformed region 406 may have a value that is ≥1 nm. In contrast, in embodiments in which the dielectric-to-dielectric bonds are formed before the metal-to-metal bonds (e.g., see FIGS. 3A to 3D), the deformed region 406 may be characterized by a distance 410 having a value in a range between 0 nm and 1 nm.

FIG. 5A is a vertical cross-sectional view of a further configuration of a first semiconductor die 102 and a second semiconductor die 104 prior to formation of die-to-die bonds between the first semiconductor die 102 and the second semiconductor die 104, and FIG. 5B is an enlarged vertical cross-sectional view of a portion of the first semiconductor die 102 and the second semiconductor die 104 of FIG. 5A, according to various embodiments. The first semiconductor die 102 may include first electrical bonding structures 180 and the second semiconductor die 104 may include second electrical bonding structures 280. The first electrical bonding structures 180 may be laterally surrounded by a first bonding-level dielectric layer 160 and the second electrical bonding structures 280 may be laterally surrounded by a second bonding-level dielectric layer 260. The first electrical bonding structures 180 and the second electrical bonding structures 280 may each be formed as bonding pads or as TSV structures, as described in greater detail, above.

As with the embodiments described above with reference to FIGS. 4A to 4F, the first electrical bonding structure 180 and the second electrical bonding structure 280 may be formed of a metal having a coefficient of thermal expansion (CTE) that is in a range from 10 ppm/K to 20 ppm/K and the first bonding-level dielectric layer 160 and the second bonding-level dielectric layer 260 may be formed of a dielectric material having a coefficient of thermal expansion that is in a range from 40 ppm/K to 60 ppm/K. For example, the first electrical bonding structure 180 and the second electrical bonding structure 280 may be formed of copper or a copper alloy, and the first bonding-level dielectric layer 160 and the second bonding-level dielectric layer 260 may be formed of a polymer material such as polyimide (CTE 50 ppm/K), polybenzoxazole (CTE 85 ppm/K), polymethyl methacrylate (CTE 193 ppm/K), benzocyclobutene (CTE 42 ppm/K), epoxy/phenol (CTE 54 ppm/K), acrylic (CTE 80 ppm/K), etc.

As shown in FIG. 5B, the first electrical bonding structure 180 may be formed within the first bonding-level dielectric layer 160 such that the first electrical bonding structure 180 includes a first portion 402a that protrudes from a first surface 404a of the first bonding-level dielectric layer 160. Similarly, the second electrical bonding structure 280 may be formed within the second bonding-level dielectric layer 260 such that the second electrical bonding structure 280 includes a second portion 402b that protrudes from a second surface 404b of the second bonding-level dielectric layer 260. According to an embodiment, each of the first portion 402a and send second portion may have a thickness in a range from approximately 5 nm to approximately 15 nm.

As shown in FIG. 5B, the first semiconductor die 102 and the second semiconductor die 104 may be placed together such that the first portion 402a of the first electrical bonding structure 180 is in contact with the second portion 402b of the second electrical bonding structure 208 such that a gap 304 is formed between the first surface 404a of the first bonding-level dielectric layer 160 and the second surface 404b of the second bonding-level dielectric layer 260. The size of the gap 304 may be approximately a sum of a thickness of the first portion 402a and the second portion 402b. As such, according to an embodiment, the gap 304 may have a size in a range from approximately 10 nm to approximately 30 nm. A first process may be performed to form metal-to-metal bonds between the first portion 402a of the first electrical bonding structure 180 and the second portion 402b of the second electrical bonding structure 208. In some embodiments, dielectric-to-dielectric bonds may also be formed during the first annealing process. Alternatively, a separate, second annealing process may be performed to generate the direct dielectric-to-dielectric bonds.

The first process may include performing a first annealing process to generate direct metal-to-metal bonds between the first electrical bonding structure 180 and the second electrical bonding structure 280. The first annealing process may be performed with or without applied compressive forces. In this regard, in some embodiments, a pressure may be applied to compress the first semiconductor die 102 and the second semiconductor die 104 toward one another. The applied compressive forces, which may be applied at an elevated temperature, may promote direct metal-to-metal bonding along with thermal diffusion of metal atoms between the first electrical bonding structure 180 and the second electrical bonding structure 280. The application of compressive forces may also act to reduce a size of the gap 304 between the first surface 404a of the first bonding-level dielectric layer 160 and the second surface 404b of the second bonding-level dielectric layer 260.

In this regard, the application of compressive forces during the first annealing process may cause deformation of one or both of the first portion 402a of the first electrical bonding structure 180 and the second portion 402b of the second electrical bonding structure 280 such that a size of the gap 304 may be reduced during the first annealing process. In instances in which the gap 304 is decreased sufficiently, the first surface 404a of the of the first bonding-level dielectric layer 160 and the second surface 404b of the second bonding-level dielectric layer 260 may come in contact and form direct dielectric-to-dielectric bonds.

In addition to the above-described processes, the gap 304 may also be reduced due to thermal expansion. In this regard, the first electrical bonding structure 180 and the second electrical bonding structure 280 may each have a greater coefficient of thermal expansion than that of the respective first bonding-level dielectric layer 160 and the second bonding-level dielectric layer 260, as described above. As such, during an annealing process, the first bonding-level dielectric layer 160 and the second bonding-level dielectric layer 260 may expand to a greater extent than that of the respective first electrical bonding structure 180 and the second electrical bonding structure 280. As such, the gap 304 may be reduced or eliminated (i.e., closed) due to the relatively greater thermal expansion of the first bonding-level dielectric layer 160 and the second bonding-level dielectric layer 260.

FIG. 5C is a vertical cross-sectional view of a configuration of the first semiconductor die 102 and the second semiconductor die 104 after formation of die-to-die bonds between the first semiconductor die 102 and the second semiconductor die 104, and FIG. 5D is an enlarged vertical cross-sectional view of a portion of the first semiconductor die 102 and the second semiconductor die 104 of FIG. 5C showing details of the die-to-die bonds, according to various embodiments. As shown, the gap 304 has been eliminated (i.e., closed) such that the first surface 404a of the first bonding-level dielectric layer 160 comes in contact with the second surface 404b of the second bonding-level dielectric layer 260.

Figure 5F:
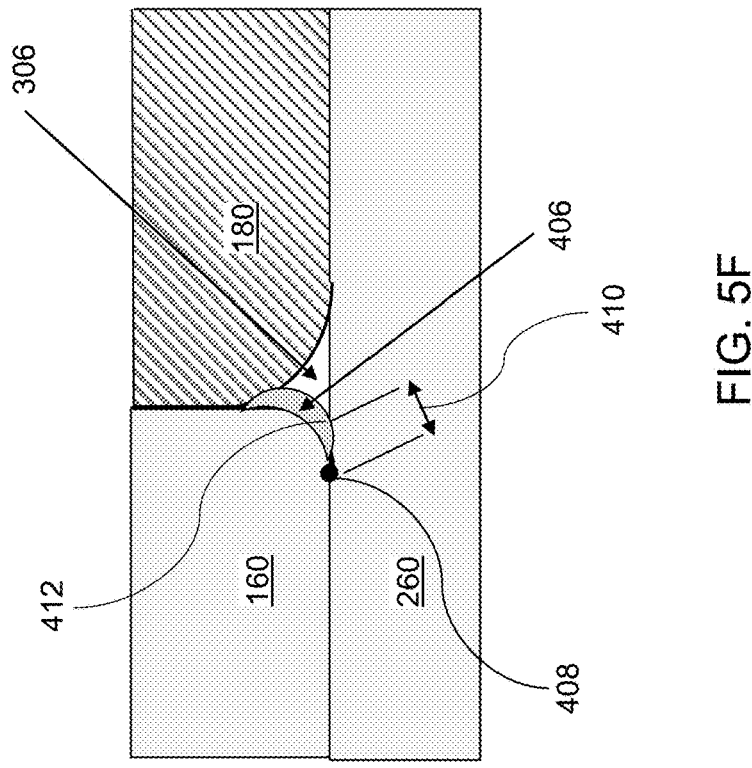
FIG. 5F is an enlarged vertical cross-sectional view of a portion of the first semiconductor die and the second semiconductor die of FIG. 5C after formation of a deformed region showing details of the deformed region, according to various embodiments.

As shown in FIGS. 5C and 5D, the first bonding-level dielectric layer 160 and the second bonding-level dielectric layer 260 may include curved surfaces that form rounded corners 414. As such, voids 306 that form near intersections of one or more of the first electrical bonding structure 180, the first bonding-level dielectric layer 160, the second electrical bonding structure 280, and the second bonding-level dielectric layer 260 may be larger than voids 306 that form in embodiments in which the first bonding-level dielectric layer 160 and the second bonding-level dielectric layer 260 have straight edges (e.g., see FIG. 3D). Such voids 306 that form in the presence of curved surfaces may also be partially or completely filed with the formation of a deformed region 406 (e.g., see FIG. 5F). In this regard, as shown in FIG. 5F, one or both of the first bonding-level dielectric layer 160 and the second bonding-level dielectric layer 260 may expand and/or flow into voids 306 to form a deformed region 406. Further, polymer materials that flow into voids 306 may chemically cross-link in forming the deformed region 406. Various processing steps (e.g., wet-clean (etching) and CMP) may lead to surfaces of the first bonding-level dielectric layer 160 and the second bonding-level dielectric layer 260 to form curved surfaces. As such, it may be difficult to avoid the formation of curved surfaces. Therefore, certain embodiments that provide for the formation of various deformed regions 406 may be advantageous in mitigating issues associated with the formation of voids 306.

Figure 5E:
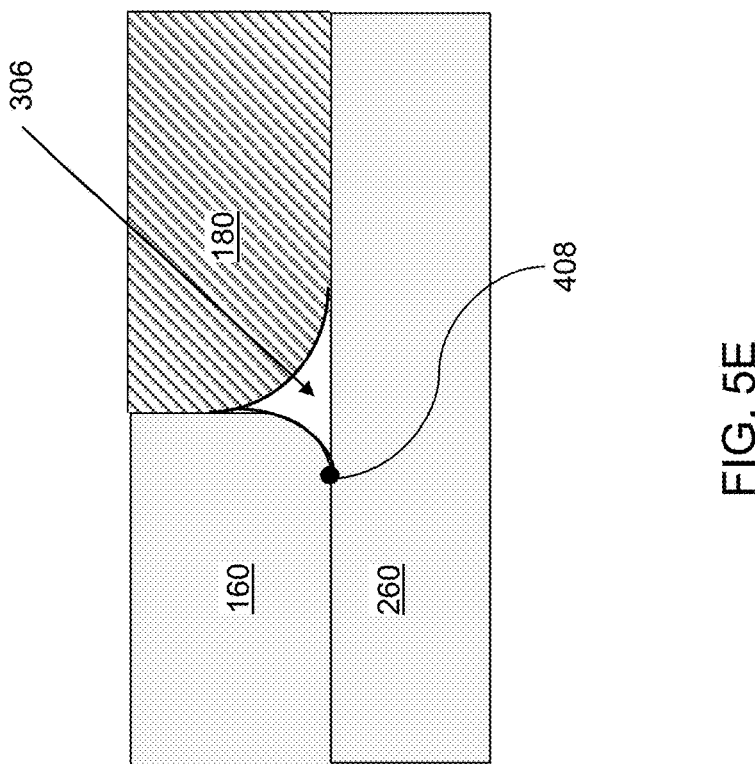
FIG. 5E is an enlarged vertical cross-sectional view of a portion of the first semiconductor die and the second semiconductor die of FIG. 5C after a gap between dielectric surfaces has been closed but prior to formation of a deformed region, according to various embodiments.

FIG. 5E is an enlarged vertical cross-sectional view of a portion of the first semiconductor die 102 and the second semiconductor die 104 after the gap 304 between the first surface 404a and the second surface 404b has been closed but prior to formation of the deformed region 406, and FIG. 5F is an enlarged vertical cross-sectional view of a portion of the first semiconductor die 102 and the second semiconductor die 104 showing details of the deformed region 406, according to various embodiments. A spatial extent of the deformed region 406 may be quantified by considering a distance 410 from a reference point 408 to a surface of the deformed region. In this example embodiment, the reference point 408 may be taken to be an intersection point between a curved surface of the first bonding-level dielectric layer 160 and a horizontal surface of the second bonding-level dielectric layer 260 prior to performance of the first and second processes, as shown in FIGS. 5E and 5F.

As shown in FIG. 5F, the distance 410 may be measured from the reference point 408 to a point 412 on a surface of the deformed region 406 that is at a boundary between the deformed region 406, the horizontal surface of the second bonding-level dielectric layer 260, and the void 306. In some example embodiments, the distance characterizing a size of the deformed region 406 may have a value that is ≥1 nm. In contrast, in embodiments in which the dielectric-to-dielectric bonds are formed before the metal-to-metal bonds (e.g., see FIGS. 3A to 3D), the deformed region 406 may be characterized by a distance 410 having a value in a range between 0 nm and 1 nm.

Figures 6A, 6B, 6C, 6D:
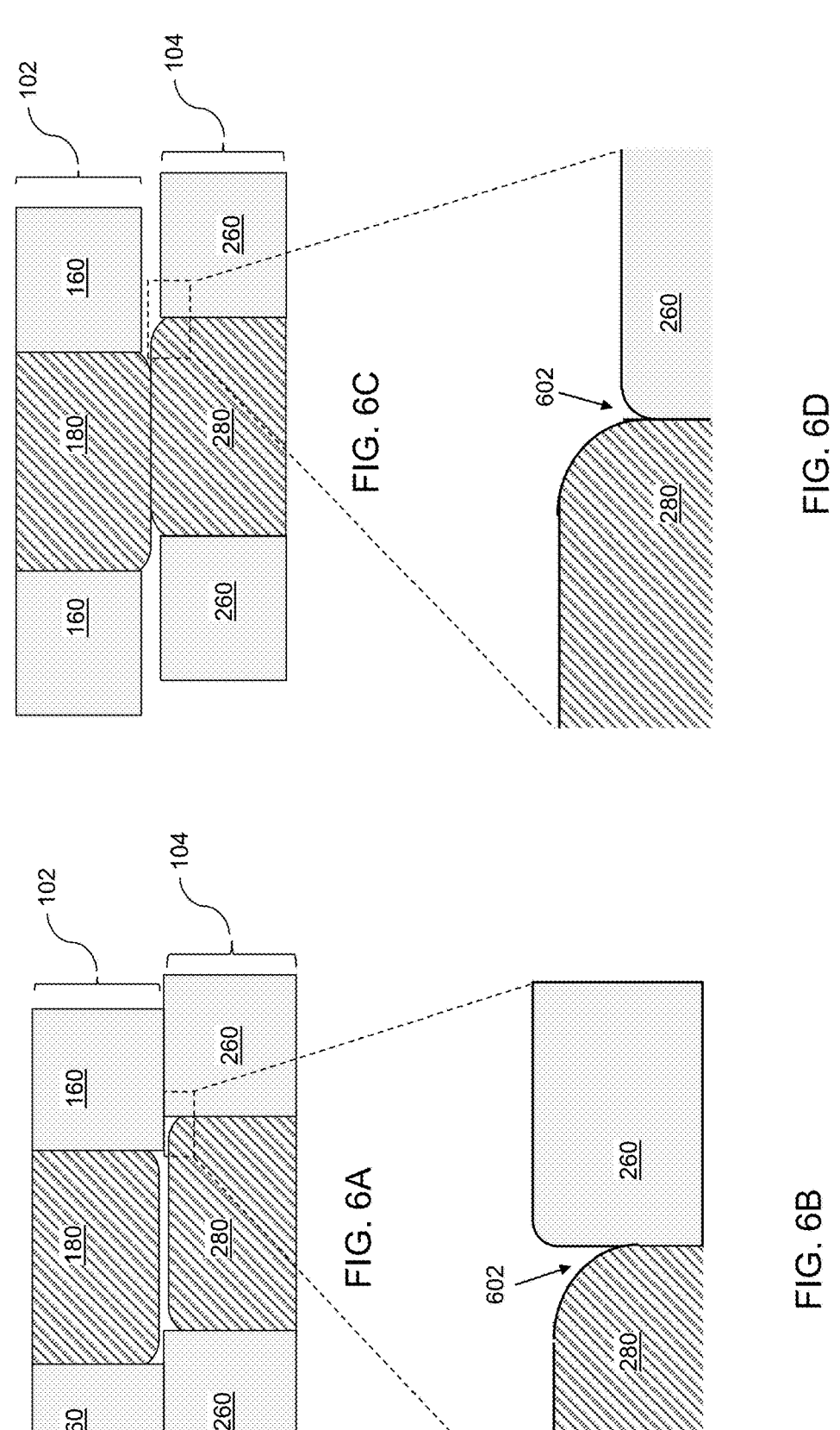
FIG. 6A is vertical cross-sectional view of a first semiconductor die and a second semiconductor die in a first configuration prior to formation of die-to die bonds, according to various embodiments.
FIG. 6B is an enlarged vertical cross-sectional view of a portion of the first semiconductor die and the second semiconductor die of FIG. 6A, according to various embodiments.
FIG. 6C is vertical cross-sectional view of a portion of a first semiconductor die and a second semiconductor die in a second configuration prior to formation of die-to die bonds, according to various embodiments.
FIG. 6D is an enlarged vertical cross-sectional view of a portion of the first semiconductor die and the second semiconductor die of FIG. 6C, according to various embodiments.

FIGS. 6A and 6B provide vertical cross-sectional views of a first semiconductor die 102 and a second semiconductor die 104 in a first configuration prior to formation of die-to die bonds, and FIGS. 6C and 6D provide vertical cross-sectional views of a first semiconductor die 102 and a second semiconductor die 104 in a second configuration prior to formation of die-to die bonds, according to various embodiments. In the first configuration (e.g., see FIGS. 6A and 6B) the first electrical bonding structure 180 and the second electrical bonding structure 280 may be recessed from the first bonding-level dielectric layer 160 and the second bonding-level dielectric layer 260, respectively, and in the second configuration (e.g., see FIGS. 6C and 6D) the first electrical bonding structure 180 and the second electrical bonding structure 280 may protrude from the first bonding-level dielectric layer 160 and the second bonding-level dielectric layer 260, respectively.

The degree to which the electrical bonding structures (180, 280) may protrude or be recessed relative to a surface of the bonding-level dielectric layers (160, 260) may be determined by processing operations. For example, the electrical bonding structures (180, 280) may be formed by electroplating (or other deposition process) into exposed areas of a patterned photoresist (not shown) over corresponding openings in the bonding-level dielectric layers (160, 260). After removal of the patterned photoresist, the electrical bonding structure (180, 280) may protrude from a surface of the bonding-level dielectric layers (160, 260) by a height comparable to a thickness of the patterned photoresist. A height of the electrical bonding structures (180, 280) above respective bonding-level dielectric layers (160, 260) may then be reduced by performing a planarization process (e.g., CMP). For example, a CMP process may be performed to reduce a height of the electrical bonding structures (180, 280) such that the electrical bonding structures (180, 280) have surfaces that are level with surfaces of the respective bonding-level dielectric layers (160, 260). An etching process may then be performed to remove surface portions of electrical bonding structures (180, 280) such that top surfaces of the electrical bonding structures (180, 280) may become recessed relative to the surfaces of the respective bonding-level dielectric layers (160, 260).

As described above (e.g., see FIGS. 3A to 3F), in the first configuration, the first bonding-level dielectric layer 160 and the second bonding-level dielectric layer 260 may have a coefficient of thermal expansion that is less than that of the first electrical bonding structure 180 and the second electrical bonding structure 280, and die-to-die bonds may be formed by first forming dielectric-to-dielectric bonds followed by metal-to-metal bonds. As also described above (e.g., see FIGS. 4A to 5F), in the second configuration, the first bonding-level dielectric layer 160 and the second bonding-level dielectric layer 260 may have a coefficient of thermal expansion that is greater than that of the first electrical bonding structure 180 and the second electrical bonding structure 280, and die-to-die bonds may be formed by first forming metal-to-metal bonds followed by dielectric-to-dielectric bonds.

In each of the first configuration (e.g., see FIGS. 6A and 6B) and the second configuration (e.g., see FIGS. 6C and 6D), it may be difficult to avoid the formation of voids 306

(e.g., see FIGS. 3D, 4E, and 5D to 5F) due to the misalignment of the first electrical bonding structure 180 and the second electrical bonding structure 280 relative to the first bonding-level dielectric layer 160 and the second bonding-level dielectric layer 260, respectively, in each of the first configuration and the second configuration. In each of the first configuration and the second configuration, an edge separation 602 may be formed due to the presence of rounded corners and misalignment of surfaces (i.e., recessed or protruding) of the first electrical bonding structure 180, first bonding-level dielectric layer 160, the second bonding-level dielectric layer 260, and the second electrical bonding structure 280. As such, void 306 formation is may occur in both the first configuration and the second configuration. Die-to-die bonding according to the second configuration, in which voids 306 may be partially or completely filled due to the formation of deformation regions 406 (e.g., see FIGS. 4D, 4F, and 5F), may be preferable to bonding according to the first configuration due to the ability to mitigate void 306 formation using the second configuration.

Figures 7A, 7B, 7C:
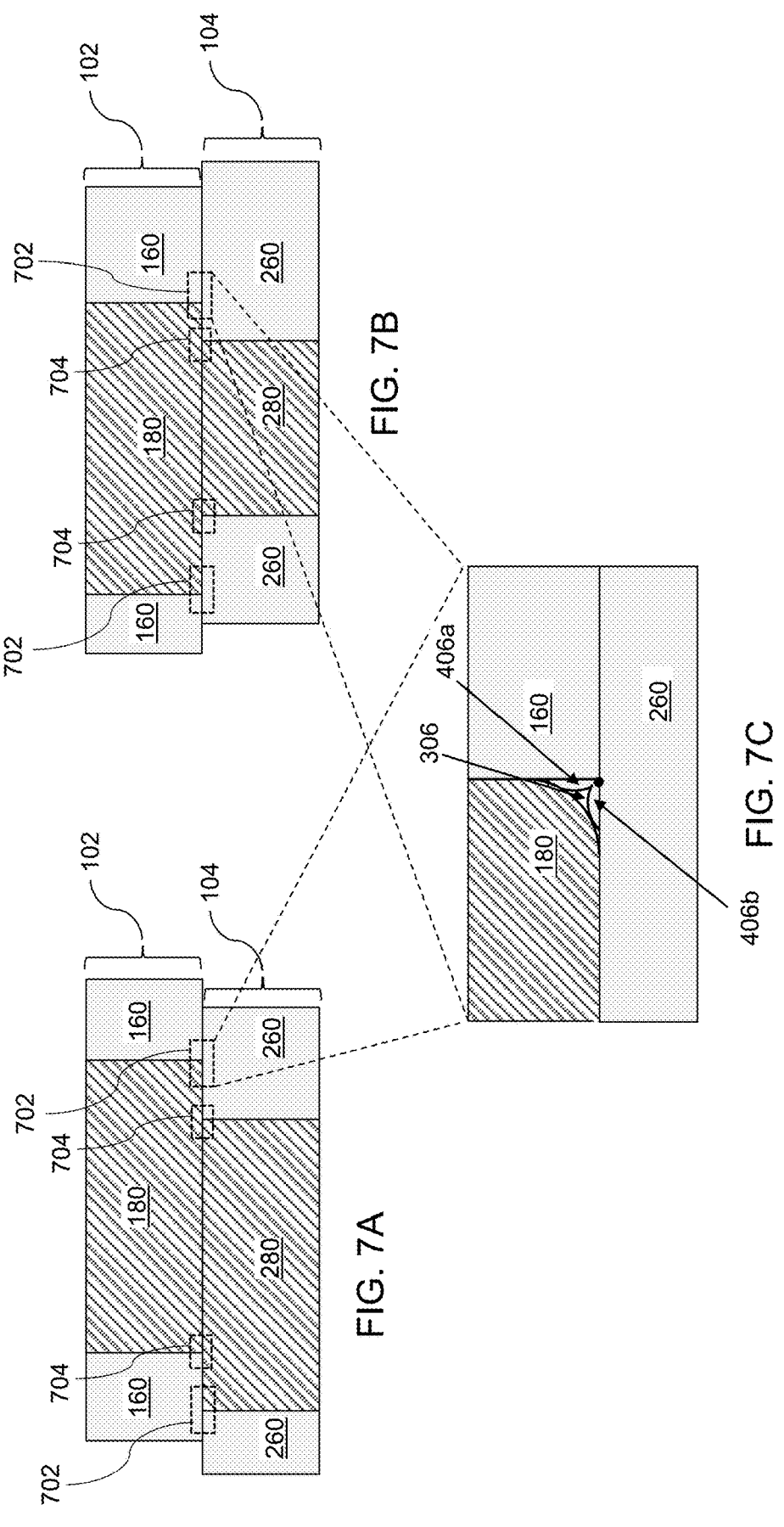
FIG. 7A is a vertical cross-sectional view of a first semiconductor die and a second semiconductor die after formation of die-to-die bonds in which the bonds have a symmetrical configuration, according to various embodiments.
FIG. 7B is a vertical cross-sectional view of a first semiconductor die and a second semiconductor die after formation of die-to-die bonds in which the bonds have an asymmetrical configuration, according to various embodiments.
FIG. 7C is an enlarged vertical cross-sectional view of a metal-dielectric interface of a die-to-die bond in the embodiments of FIGS. 7A and 7B, according to various embodiments.

FIG. 7A is a vertical cross-sectional view of a first semiconductor die 102 and a second semiconductor die 104 after formation of die-to-die bonds in which the bonds have a symmetrical configuration, and FIG. 7B is a vertical cross-sectional view of a first semiconductor die 102 and a second semiconductor die 104 after formation of die-to-die bonds in which the bonds have an asymmetrical configuration, according to various embodiments. FIG. 7C is an enlarged vertical cross-sectional view of a metal-dielectric interface of a die-to-die bond in the embodiments of FIGS. 7A and 7B, according to various embodiments. The symmetrical configuration of FIG. 7A may include a first electrical bonding structure 180 and a second electrical bonding structure 280 that each have a similar width, although as shown, the first electrical bonding structure 180 and the second electrical bonding structure 280 may be laterally displaced with respect to one another. In contrast, the asymmetrical configuration of FIG. 7B may include a first electrical bonding structure 180 and a second electrical bonding structure 280 having different widths. Embodiments such as those of FIGS. 7A and 7B may increase manufacturing design flexibility by relaxing a requirement for close alignment of the first electrical bonding structure 180 and the second electrical bonding structure 280. Further, the use of asymmetric configurations may provide an increased process window for bonding (i.e., may relax constraints on tight alignment).

In each of the symmetric configuration of FIG. 7A and the asymmetric configuration of FIG. 7B a first type of metal-dielectric interface 702 and a second type of metal-dielectric interface 704 may be formed. In the first type of metal-dielectric interface 702, a corner of a metal bonding structure (e.g., the first electrical bonding structure 180) may be surrounded on two sides by dielectric layers (160, 260), as shown in further detail in FIG. 7C. In the second type of metal-dielectric interface 704, a corner of a dielectric layer (160, 260) may be surrounded on two sides by electrical bonding structures (180, 280). As shown in FIG. 7C, a deformed region (406a, 406b) may be formed by deformation of one or both of the first bonding-level dielectric layer 160 the second bonding-level dielectric layer 260. For example, a first portion 406a of the deformed region (406a, 406b) may be formed by deformation of the first bonding-level dielectric layer 160 into a void 306, and a second portion 406b of the deformed region (406a, 406b) may be formed by deformation of the second bonding-level dielectric layer 260 into a void 306. Similar deformation of a corner of the dielectric layer (160, 260) may also occur to thereby form a deformed region (not shown) in the second type of metal-dielectric interface 704.

Figures 8A, 8B, 8C:
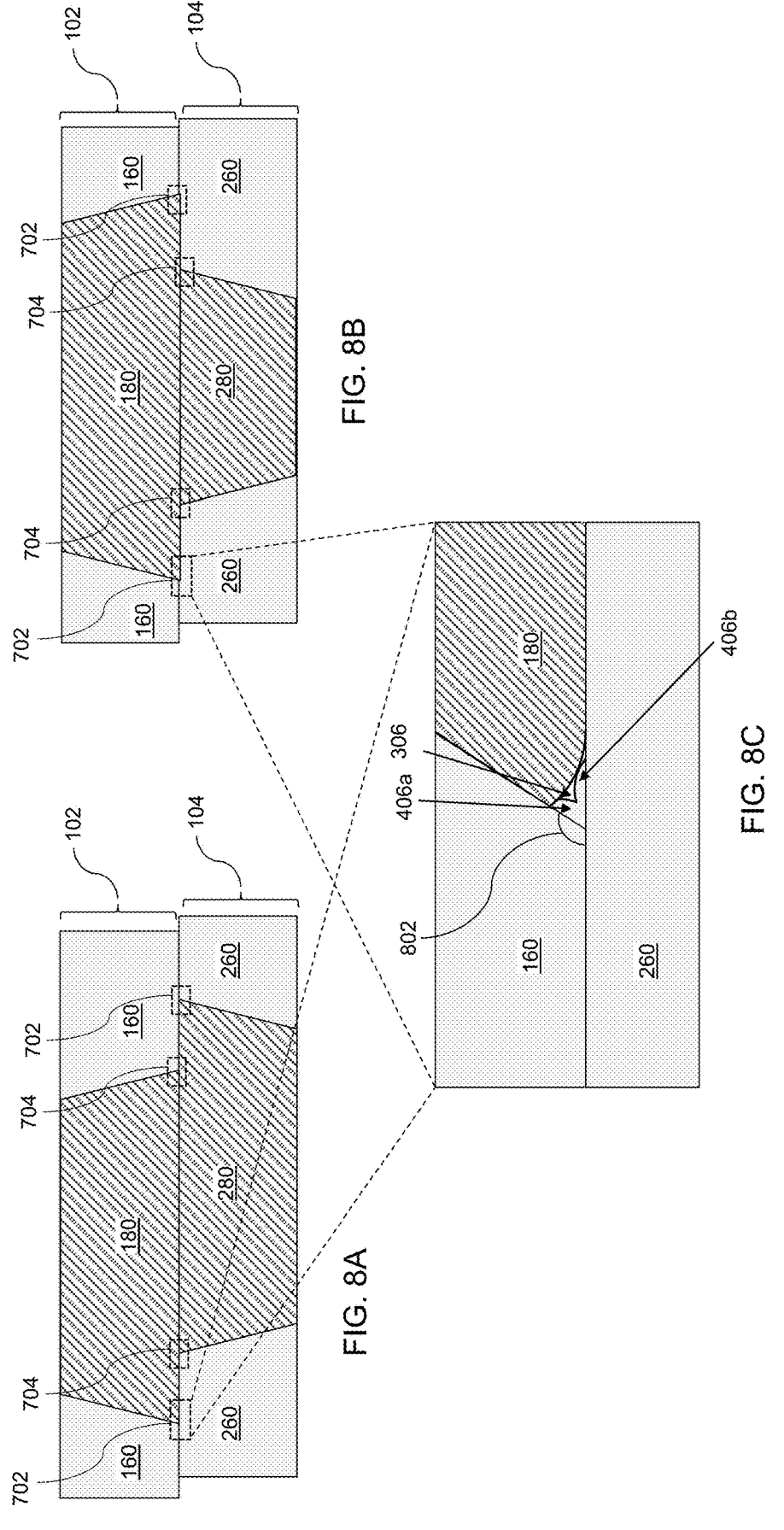
FIG. 8A is a vertical cross-sectional view of a first semiconductor die and a second semiconductor die after formation of die-to-die bonds in which the bonds have a symmetrical configuration with angled surfaces, according to various embodiments.
FIG. 8B is a vertical cross-sectional view of a first semiconductor die and a second semiconductor die after formation of die-to-die bonds in which the bonds have an asymmetrical configuration with angled surfaces, according to various embodiments.
FIG. 8C is an enlarged vertical cross-sectional view of a metal-dielectric interface of a die-to-die bond in the embodiments of FIGS. 8A and 8B, according to various embodiments.

FIG. 8A is a vertical cross-sectional view of a first semiconductor die 102 and a second semiconductor die 104 after formation of die-to-die bonds in which the bonds have a symmetrical configuration with angled surfaces, and FIG. 8B is a vertical cross-sectional view of a first semiconductor die 102 and a second semiconductor die 104 after formation of die-to-die bonds in which the bonds have an asymmetrical configuration with angled surfaces, according to various embodiments. FIG. 8C is an enlarged vertical cross-sectional view of a metal-dielectric interface of a die-to-die bond in the embodiments of FIG. 8A or 8B, according to various embodiments. The symmetrical configuration of FIG. 8A may include a first electrical bonding structure 180 and a second electrical bonding structure 280 that each have a similar width, although as shown, the first electrical bonding structure 180 and the second electrical bonding structure 280 may be laterally displaced with respect to one another. In contrast, the asymmetrical configuration of FIG. 8B may include a first electrical bonding structure 180 and a second electrical bonding structure 280 having different widths.

As shown, the first electrical bonding structure 180 and the second electrical bonding structure 280 need not have right-angle surfaces. In this regard, each of the first electrical bonding structure 180 and the second electrical bonding structure 280 may have one or more surfaces that form a non-right-angle 802 with respect to a surface of the first bonding-level dielectric layer 160 and/or with respect to a surface the second bonding-level dielectric layer 260. For example, as shown in FIG. 8C, a surface of the first electrical bonding structure 180 may form an obtuse angle 802 with respect to a surface of the first bonding-level dielectric layer 160. In the example embodiment of FIG. 8C, the surface of the first electrical bonding structure 180 may also form an obtuse angle 802 with respect to a surface of the second bonding-level dielectric layer 260. Other embodiments may include surfaces of the first electrical bonding structure 180 and the second electrical bonding structure 280 that may form acute angles (not shown) with respect to one or more surfaces of the first electrical bonding structure 180 and the second electrical bonding structure 280. Embodiments including configurations such as those of FIGS. 8A and 8B may increase manufacturing design flexibility because perfect alignment between the first electrical bonding structure 180 and the second electrical bonding structure 280 is not required and a need to form right-angle interfaces is not required.

As with the embodiments of FIGS. 7A to 7C, each of the symmetric configuration of FIG. 8A, and the asymmetric configuration of FIG. 8B, a first type of metal-dielectric interface 702 and a second type of metal-dielectric interface 704 may be formed. In the first type of metal-dielectric interface 702, a corner of a metal bonding structure (e.g., the first electrical bonding structure 180) may be surrounded on two sides by dielectric layers (160, 260), as shown in further detail in FIG. 8C. In the second type of metal-dielectric interface 704, a corner of a dielectric layer (160, 260) may be surrounded on two sides by an electrical bonding structures (180, 280). As shown in FIG. 8C, a deformed region (406a, 406b) may be formed by deformation of one or both of the first bonding-level dielectric layer 160 the second bonding-level dielectric layer 260. For example, a first portion 406a of the deformed region (406a, 406b) may be formed by deformation of the first bonding-level dielectric layer 160 into a void 306, and a second portion 406b of the deformed region (406a, 406b) may be formed by deformation of the second bonding-level dielectric layer 260 into a void 306. Similar deformation of a corner of the dielectric layer (160, 260) may also occur to thereby form a deformed region (not shown) in the second type of metal-dielectric interface 704. In some embodiments, a degree to which the deformed region (406a, 406b) may fill a void 306 may depend on the angle 802 of the surfaces. For example, in some embodiments, angled surfaces such as those in FIGS. 8A to 8C may have voids 306 that are filled to a greater degree than those of surfaces that form right angles to one another (e.g., as shown in FIGS. 7A to 7C).

Figures 9A, 9B:
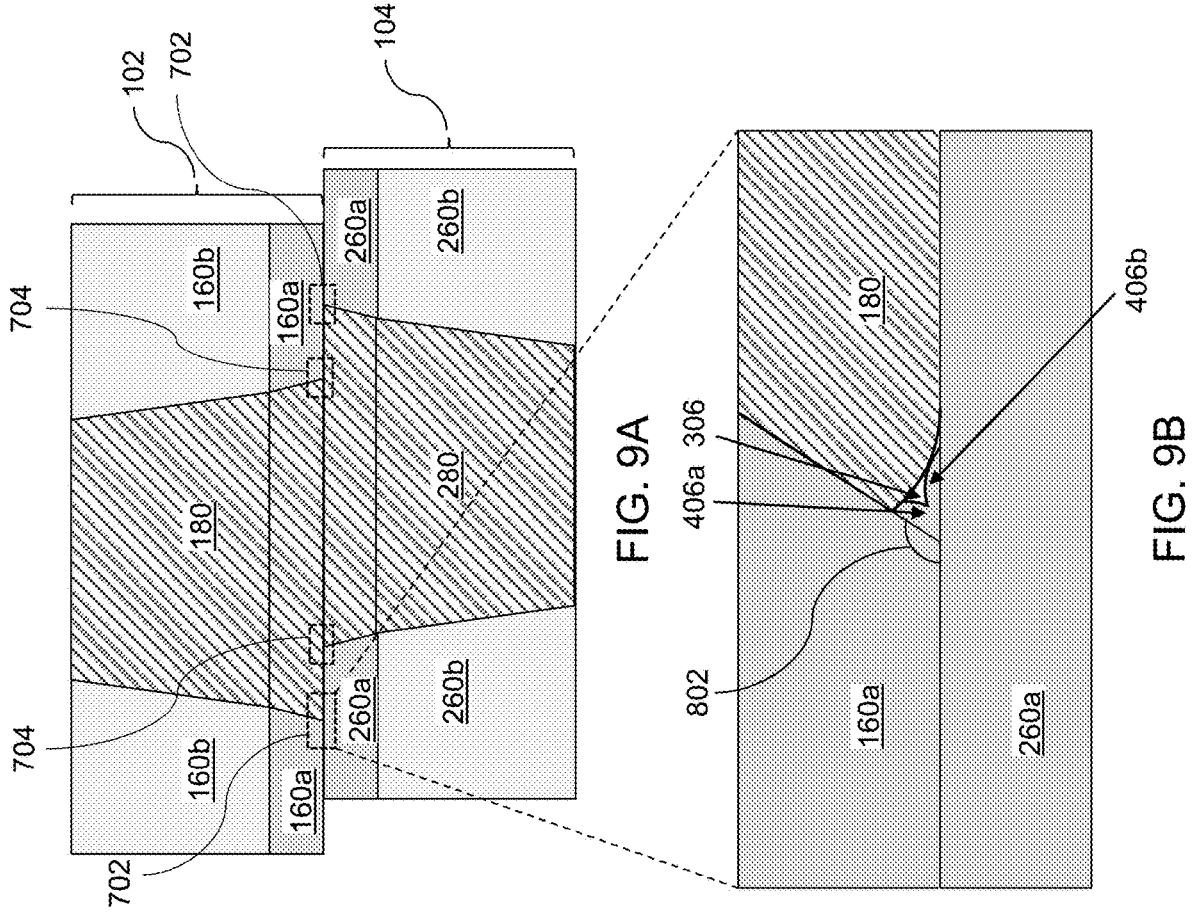
FIG. 9A is a vertical cross-sectional view of a first semiconductor die and a second semiconductor die after formation of die-to-die bonds in which the bonds have a symmetrical configuration with angled surfaces and multi-layer dielectrics, according to various embodiments.
FIG. 9B is an enlarged vertical cross-sectional view of a metal-dielectric interface of a die-to-die bond in the embodiment of FIG. 9A, according to various embodiments.

FIG. 9A is a vertical cross-sectional view of a first semiconductor die and a second semiconductor after formation of die-to-die bonds in which the bonds have a symmetrical configuration with angled surfaces and multi-layer dielectrics, and FIG. 9B is an enlarged vertical cross-sectional view of a metal-dielectric interface of a die-to-die bond in the embodiment of FIG. 9A, according to various embodiments. The bonding configuration of FIG. 9A is similar to that of FIG. 8A. In this regard, a first electrical bonding structure 180 and a second electrical bonding structure 280 may each have a similar size and may have angled surfaces. For example, each of the first electrical bonding structure 180 and the second electrical bonding structure 280 may have one or more surfaces that form a non-right-angle 802 with respect to an interface between the first bonding-level dielectric (160a, 160b) and/or with respect to the second bonding-level dielectric layer (260a, 260b) as shown, for example, in FIG. 9B. In contrast to the configuration of FIG. 8A, however, the first bonding-level dielectric (160a, 160b) and the second bonding-level dielectric layer (206a, 260b) may be multi-level structures.

As shown in FIG. 9B, a deformed region (406a, 406b) may be formed by deformation of one or both of the first bonding-level dielectric layer 160a the second bonding-level dielectric layer 260a. For example, a first portion 406a of the deformed region (406a, 406b) may be formed by deformation of the first bonding-level dielectric layer 160a into a void 306, and a second portion 406b of the deformed region (406a, 406b) may be formed by deformation of the second bonding-level dielectric layer 260a into a void 306. Similar deformation of a corner of the dielectric layer (160, 260) may also occur to thereby form a deformed region (not shown) in the second type of metal-dielectric interface 704.

Embodiments including configurations such as those of FIGS. 9A and 9B may increase manufacturing design flexibility because perfect alignment between the first electrical bonding structure 180 and the second electrical bonding structure 280 is not required, a need to form right-angle interfaces is not required, and multi-layered structures (160a, 160b, 260a, 260b) may be provided. In this regard, the use of multi-layer dielectric structures may be advantageous in BEOL processes. For example, some dielectrics may have a relatively higher deposition rate than others. Such dielectrics that may be deposited more quickly may be used for filling gaps while other dielectrics may be used for etch-stop layers or CMP-stop layers. In this regard, a selection of dielectric layers in a multi-layer dielectric structure may be determined based on BEOL design rules.

Figures 10A, 10B:
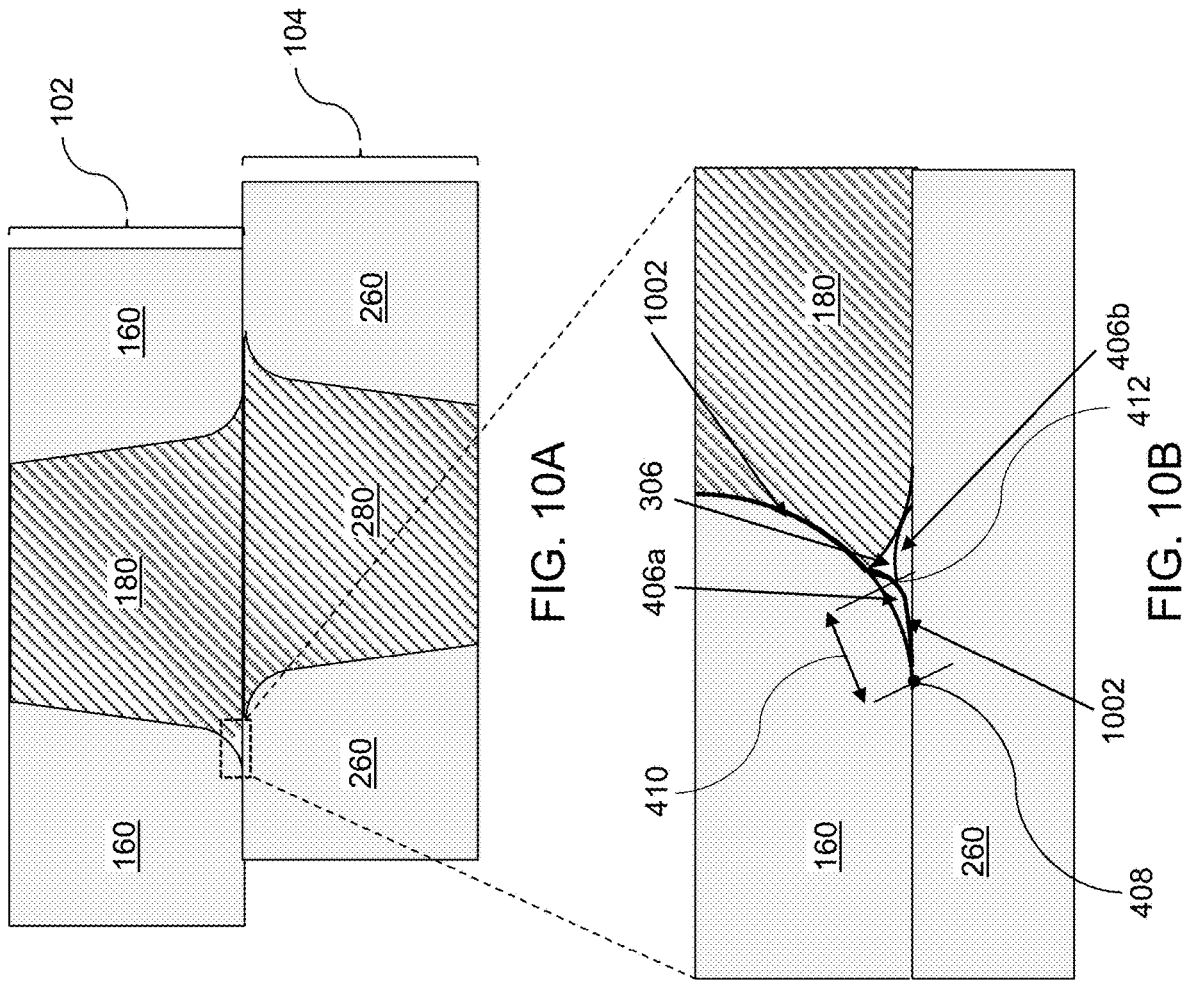
FIG. 10A is a vertical cross-sectional view of a first semiconductor die and a second semiconductor die after formation of die-to-die bonds in which the bonds have a symmetrical configuration with angled surfaces and non-linear boundaries, according to various embodiments.
FIG. 10B is an enlarged vertical cross-sectional view of a metal-dielectric interface of a die-to-die bond in the embodiment of FIG. 10A, according to various embodiments.

FIG. 10A is a vertical cross-sectional view of a first semiconductor die 102 and a second semiconductor die 104 after formation of die-to-die bonds in which the bonds have a symmetrical configuration with angled surfaces and non-linear boundaries, according to various embodiments. FIG. 10B is an enlarged vertical cross-sectional view of a metal-dielectric interface of a die-to-die bond in the embodiment of FIG. 10A, according to various embodiments. The bonding configuration of FIG. 10A is similar to that of FIG. 9A. In this regard, a first electrical bonding structure 180 and a second electrical bonding structure 280 may each have a similar size and may have angled surfaces. In contrast to the configuration of FIGS. 9A and 9B, however, the metal-dielectric interface between the first electrical bonding structure 180 and the first bonding-level dielectric layer 160 may have a non-linear boundary. Similarly, in some embodiments, the metal-dielectric interface between the second electrical bonding structure 280 and the second bonding-level dielectric layer 260 may also have a non-linear boundary. As shown in FIG. 10B, for example, the non-linear boundary may have a shape corresponding to that of a seed layer 1002 (e.g., a Ta/Cu seed layer used in an electroplating process to form the first electrical bonding structure 180 as a Cu bonding structure).

As shown in FIG. 10B, a deformed region (406a, 406b) may be formed by deformation of one or both of the first bonding-level dielectric layer 160a the second bonding-level dielectric layer 260a. For example, a first portion 406a of the deformed region (406a, 406b) may be formed by deformation of the first bonding-level dielectric layer 160a into a void 306, and a second portion 406b of the deformed region (406a, 406b) may be formed by deformation of the second bonding-level dielectric layer 260a into the void 306. As shown, for example, in FIG. 10B, a degree of deformation may correspond to displacement of the seed layer 1002 as the first portion 406a of the deformed region (406a, 406b) is displaced into the void 306.

A spatial extent of the deformed region 406 may be quantified by considering a distance 410 from a reference point 408 to a surface of the deformed region. In this example embodiment, the reference point 408 may be taken to be an intersection point between a curved surface of the first bonding-level dielectric layer 160 and a horizontal surface of the second bonding-level dielectric layer 260 prior to the formation of the deformed region (406a, 406b), as shown in FIG. 10B. The distance 410 may be measured from the reference point 408 to a closest point 412 on a surface of the deformed region 406. In some example embodiments, the distance characterizing a size of the deformed region 406 may have a value that is ≥1 nm. In contrast, in embodiments in which the dielectric-to-dielectric bonds are formed before the metal-to-metal bonds (e.g., see FIGS. 3A to 3D), the deformed region 406 may be characterized by a distance 410 having a value in a range between 0 nm and 1 nm.

The above-described embodiments include structures and methods of forming hybrid die-to-die bonds between a first semiconductor die 102 and a second semiconductor die 104. The disclosed embodiments are provided merely as examples and similar techniques may be used to form hybrid bonds between various other types of semiconductor device components. For example, the disclosed embodiments may be used to form hybrid bonds between a semiconductor die and an interposer, between a semiconductor die and a package substrate, between an integrated passive device and an interposer or a package substrate, between a bridge die and a package substrate, etc.

FIG. 11 is a flowchart illustrating operations of a method 1100 of forming a hybrid bond between a first semiconductor device component (e.g., first semiconductor die 102) and a second semiconductor device component (e.g., second semiconductor die 104). In operation 1102, the method 1100 may include forming the first semiconductor device component 102 including a first electrical bonding structure (e.g., first electrical bonding structure 180) formed within a first dielectric material (e.g., first bonding-level dielectric layer 160). In operation 1104, the method 1100 may include forming the second semiconductor device component 104 including a second electrical bonding structure (e.g., second electrical bonding structure 280) formed within a second dielectric material 260. In operation 1106, the method 1100 may include placing the first semiconductor device component 102 and the second semiconductor device component 104 together such that the first electrical bonding structure 180 is in contact with the second electrical bonding structure 280 (e.g., see FIG. 4B). In operation 1108, the method 1100 may include performing a first annealing process that forms a direct metal-to-metal bond between the first electrical bonding structure 180 and the second electrical bonding structure 280 (e.g., see FIGS. 4C, 4D, 5C, and 5D). In operation 1110, the method 1100 may include performing a second annealing process that forms a direct dielectric-to-dielectric bond between the first dielectric material 160 and the second dielectric material 260 (e.g., see FIGS. 4C, 4D, 5C, and 5D). In one embodiment, the second annealing process may be performed subsequent to performing the first annealing process. In certain embodiments, the second annealing process may cause deformation of one or both of the first dielectric material 160 and the second dielectric material 260 thereby generating a deformed region 406 of dielectric material that partially fills a void 306 between one or more of the first electrical bonding structure 180, the first dielectric material 160, the second electrical bonding structure 280, and the second dielectric material 260.

According to the method 1100, forming the first semiconductor device component 102, in operation 1102, may further include forming the first electrical bonding structure 180 to include a first metal having a first metal coefficient of thermal expansion, and forming the first dielectric material 160 to have a first dielectric coefficient of thermal expansion that is greater than the first metal coefficient of thermal expansion. According to the method 1100, forming the second semiconductor device component 104, in operation 1104, may further include forming the second electrical bonding structure 280 to include a second metal having a second metal coefficient of thermal expansion, and forming the second dielectric material 260 to have a second dielectric coefficient of thermal expansion that is greater than the second metal coefficient of thermal expansion.

According to the method 1100, forming the first semiconductor device component 102, in operation 1102, and forming the second semiconductor device component 104, in operation 1104, may further include forming the first metal and the second metal such that each of the first metal coefficient of thermal expansion and the second metal coefficient of thermal expansion is within a first range from 10 ppm/K to 20 ppm/K, and forming the first dielectric material 160 and the second dielectric material 260 such that each of the first dielectric coefficient of thermal expansion and the second dielectric coefficient of thermal expansion is within a second range from 40 ppm/K to 60 ppm/K. The method 1100 may further include forming each of the first dielectric material 160 and the second dielectric material 260 to include one of polyimide, polybenzoxazole, polymethyl methacrylate, and benzocyclobutene. The method 1100 may further include forming the first electrical bonding structure 180 within the first dielectric material 160 such that the first electrical bonding structure 180 includes a first portion 402a that protrudes from a first surface 404a of the first dielectric material 160, and forming the second electrical bonding structure 280 within the second dielectric material 260 such that the second electrical bonding structure 280 includes a second portion 402b that protrudes from a second surface 404b of the second dielectric material 260.

According to the method 1100, placing the first semiconductor device component 102 and the second semiconductor device component 104 together, in operation 1106, may further include placing the first portion 402a of the first electrical bonding structure 180 in contact with the second portion 402b of the second electrical bonding structure 280 such that a gap 304 is formed between the first surface 404a of the first dielectric material 160 and the second surface 404b of the second dielectric material 260. The method 1100 may further include applying a pressure to compress the first semiconductor device component 102 and the second semiconductor device component 104 toward one another such that a size of the gap 304 is reduced. The method 1100 may further include deforming one or both of the first portion 402a of the first electrical bonding structure 180 and the second portion 402b of the second electrical bonding structure 280 such that a size of the gap 304 is reduced during the first annealing process. The method 1100 may further include performing the first annealing process or the second annealing process such that a size of the gap 304 is reduced due to a first thermal expansion of the first dielectric material 160 and the second dielectric material 260 that is larger than a second thermal expansion of the first electrical bonding structure 180 and the second electrical bonding structure 280.

The method 1100 may further include deforming one or both of the first dielectric material 160 and the second dielectric material 260 to decrease a size of one or more voids 306 located between one or more of the first electrical bonding structure 180, the first dielectric material 160, the second electrical bonding structure 280, and the second dielectric material 260. The method 1100 may further include decreasing a size of the one or more voids 306 from a first size to a second size such that the second size is smaller than the first size by a difference that is greater than or equal to 1 nm.

FIG. 12 is a flowchart illustrating operations of a further method 1200 of forming a hybrid bond between a first semiconductor device component 102 (e.g., first semiconductor die 102) and a second semiconductor device component 104 (e.g., second semiconductor die 104). In operation 1202, the method 1200 may include placing the first semiconductor device component 102 and the second semiconductor device component 104 together such that a first electrical bonding structure 180 of the first semiconductor device component 102 is in contact with a second electrical bonding structure 280 of the second semiconductor device component 104.

In this regard, the first electrical bonding structure 180 may protrude (e.g., may have a first portion 402a that protrudes) from a first dielectric material 160 of the first semiconductor device component 102 and the second electrical bonding structure 280 may protrude (e.g., may have a second portion 402b that protrudes) from a second dielectric material 260 of the second semiconductor device component 104 such that a gap 304 is formed between a first surface 404a of the first dielectric material 160 and a second surface 404b of the second dielectric material 260. In operation 1204, the method 1200 may include performing a first annealing process that forms a direct metal-to-metal bond (e.g., see FIGS. 4C, 4D, 5C, and 5D) between the first electrical bonding structure 180 and the second electrical bonding structure 280. In operation 1206, the method 1200 may include performing, after the first annealing process, a second annealing process that reduces a size of the gap and forms a direct dielectric-to-dielectric bond (e.g., see FIGS. 4C, 4D, 5C, and 5D) between the first dielectric material 160 and the second dielectric material 260.

According to the method 1200, performing one or both of the first annealing process, in operation 1204, and the second annealing process, in operation 1206, may further include applying a pressure to compress the first semiconductor device component 102 and the second semiconductor device component 104 toward one another such that a size of the gap 304 is reduced. According to the method 1200, performing the first annealing process, in operation 1204, may further include deforming one or both of a first portion 402a of the first electrical bonding structure 180 and a second portion 402b of the second electrical bonding structure 280 such that a size of the gap 304 is reduced during the first annealing process.

The method 1200 may further include performing the first annealing process or the second annealing process such that a size of the gap 304 is reduced due to a first thermal expansion of the first dielectric material 160 and the second dielectric material 260 that is larger than a second thermal expansion of the first electrical bonding structure 180 and the second electrical bonding structure 280. According to the method 1200, performing the second annealing process, in operation 1206, may further include deforming one or both of the first dielectric material 160 and the second dielectric material 260 to decrease a size of one or more voids 306 located between one or more of the first electrical bonding structure 180, the first dielectric material 160, the second electrical bonding structure 280, and the second dielectric material 260 (e.g., see deformed regions (406, 406a, 406b) in FIGS. 4D, 4F, 5F, 7C, 8C, 9B, and 10B).

Referring to all drawings and according to various embodiments of the present disclosure, a semiconductor device structure (100a, 100b, 200) is provided. The semiconductor device structure (100a, 100b, 200) may include a first semiconductor device component (e.g., first semiconductor die 102) including a first electrical bonding structure (e.g., first electrical bonding structure 180) formed within a first dielectric material (e.g., first bonding-level dielectric layer 160) and a second semiconductor device component (e.g., second semiconductor die 104) including a second electrical bonding structure (e.g., second electrical bonding structure 280) formed within a second dielectric material (e.g., second bonding-level dielectric layer 260). The semiconductor device structure (100a, 100b, 200) may include a direct metal-to-metal bond formed between the first electrical bonding structure 180 and the second electrical bonding structure 280 and a direct dielectric-to-dielectric bond formed between the first dielectric material 160 and the second dielectric material 260 (e.g., see FIGS. 4C, 4D, 5C, and 5D).

In various embodiments, the first electrical bonding structure 180 may include a first metal having a first metal coefficient of thermal expansion that is less than a first dielectric coefficient of thermal expansion of the first dielectric material 160 and the second electrical bonding structure 280 may include a second metal having a second metal coefficient of thermal expansion that is less than a second dielectric coefficient of thermal expansion of the second dielectric material 260. In certain embodiments, the first electrical bonding structure 180 may be laterally displaced relative to second electrical bonding structure 280 (e.g., see FIGS. 7A to 8B). Further, in some embodiments, one or both of the first electrical bonding structure 180 and the second electrical bonding structure 280 may include a surface that subtends a non-right-angle with respect to an interface between the first dielectric material 160 and the second dielectric material 260 (e.g., see FIGS. 8A to 10B). In further embodiments, one or both of the first dielectric material 160 and the second dielectric material 260 may include one of polyimide, polybenzoxazole, polymethyl methacrylate, or benzocyclobutene.

Disclosed embodiment methods of forming hybrid bonds between a first semiconductor device component and a second semiconductor device component may provide advantages by forming metal-metal bonds in a first process followed by forming dielectric-to-dielectric bonds in a second process. In this regard, a first bonding structure and a second bonding structure may protrude from surfaces of respective first and second surrounding dielectric materials such that, when placed together, the first bonding structure and the second bonding structure are in contact with one another while leaving a gap between surfaces of the first and second surrounding dielectric materials. The disclosed methods are in contrast to alternative methods in which the dielectric-to-dielectric bonds are formed before the metal-to-metal bonds. In such alternative methods the first and second bonding structures must be recessed with respect to surfaces of the first and second dielectric materials and precise control of a recess depth must be maintained to achieve good quality metal-to-metal bonds. Disclosed embodiment methods may provide greater manufacturing flexibility because precise control of a size of a protruding portion of first and second bonding structures is not required due to the fact that the first and second bonding structure may deform during one or more annealing processes to overcome process variations in the size of the protruding portions. Disclosed embodiments may also be advantageous by providing dielectric materials that may expand and/or flow into voids to thereby reduce or mitigate void formation.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of forming a hybrid bond between a first semiconductor device component and a second semiconductor device component, comprising:
   forming the first semiconductor device component comprising a first electrical bonding structure formed within a first dielectric material;
   forming the second semiconductor device component comprising a second electrical bonding structure formed within a second dielectric material;
   placing the first semiconductor device component and the second semiconductor device component together such that the first electrical bonding structure is in contact with the second electrical bonding structure;
   performing a first annealing process that forms a direct metal-to-metal bond between the first electrical bonding structure and the second electrical bonding structure; and performing a second annealing process that forms a direct dielectric-to-dielectric bond between the first dielectric material and the second dielectric material,
   wherein the second annealing process causes deformation of one or both of the first dielectric material and the second dielectric material thereby generating a deformed region of dielectric material that partially fills a void between one or more of the first electrical bonding structure, the first dielectric material, the second electrical bonding structure, and the second dielectric material.

2. The method of claim 1, wherein:
   forming the first semiconductor device component further comprises:
      forming the first electrical bonding structure to comprise a first metal having a first metal coefficient of thermal expansion; and
      forming the first dielectric material to have a first dielectric coefficient of thermal expansion that is greater than the first metal coefficient of thermal expansion,
   wherein forming the second semiconductor device component further comprises:
      forming the second electrical bonding structure to comprise a second metal having a second metal coefficient of thermal expansion; and
      forming the second dielectric material to have a second dielectric coefficient of thermal expansion that is greater than the second metal coefficient of thermal expansion, and
   wherein the second annealing process is performed subsequent to the first annealing process.

3. The method of claim 2, wherein forming the first semiconductor device component and forming the second semiconductor device component further comprises:
   forming the first metal and the second metal such that each of the first metal coefficient of thermal expansion and the second metal coefficient of thermal expansion is within a first range from 10 ppm/K to 20 ppm/K; and
   forming the first dielectric material and the second dielectric material such that each of the first dielectric coefficient of thermal expansion and the second dielectric coefficient of thermal expansion is within a second range from 40 ppm/K to 60 ppm/K.

4. The method of claim 1, further comprising:
   forming each of the first dielectric material and the second dielectric material to comprise one of polyimide, polybenzoxazole, polymethyl methacrylate, or benzocyclobutene.

5. The method of claim 1, further comprising:
   forming the first electrical bonding structure within the first dielectric material such that the first electrical bonding structure comprises a first portion that protrudes from a first surface of the first dielectric material; and
   forming the second electrical bonding structure within the second dielectric material such that the second electrical bonding structure comprises a second portion that protrudes from a second surface of the second dielectric material.

6. The method of claim 5, wherein placing the first semiconductor device component and the second semiconductor device component together further comprises placing the first portion of the first electrical bonding structure in contact with the second portion of the second electrical bonding structure such that a gap is formed between the first surface of the first dielectric material and the second surface of the second dielectric material.

7. The method of claim 6, further comprising:

applying a pressure to compress the first semiconductor device component and the second semiconductor device component toward one another such that a size of the gap is reduced.

8. The method of claim 6, further comprising:

deforming one or both of the first portion of the first electrical bonding structure and the second portion of the second electrical bonding structure such that a size of the gap is reduced during the first annealing process.

9. The method of claim 6, further comprising:

performing the first annealing process or the second annealing process such that a size of the gap is reduced due to a first thermal expansion of the first dielectric material and the second dielectric material that is larger than a second thermal expansion of the first electrical bonding structure and the second electrical bonding structure.

10. The method of claim 1, further comprising:

deforming one or both of the first dielectric material and the second dielectric material to decrease a size of one or more voids located between one or more of the first electrical bonding structure, the first dielectric material, the second electrical bonding structure, and the second dielectric material.

11. The method of claim 10, further comprising:

decreasing a size of the one or more voids from a first size to a second size such that the second size is smaller than the first size by a difference that is greater than or equal to 1 nm.

12. A method of bonding a first die and a second die, the method comprising:

placing the first die on the second die such that a first metal structure of the first die contacts a second metal structure of the second die;

performing a first annealing process that forms a direct metal-to-metal bond between the first metal structure and the second metal structure; and performing a second annealing process that forms a direct dielectric-to-dielectric bond between a first dielectric material of the first die and a second dielectric material of the second die, wherein the second annealing process causes deformation of at least one of the first dielectric material and the second dielectric material thereby forming a deformed region of dielectric material in a void between the first die and the second die.

13. The method of claim 12, wherein the void comprises a first void between the first metal structure and the first dielectric material, and the forming of the deformed region comprises forming the deformed region in the first void.

14. The method of claim 12, wherein the void comprises a second void between the second metal structure and the second dielectric material, and the forming of the deformed region comprises forming the deformed region in the second void.

15. The method of claim 12, wherein the forming of the deformed region comprises at least partially filling the void with the deformed region.

16. The method of claim 12, wherein the performing of the second annealing process occurs after the performing of the first annealing process.

17. The method of claim 12, further comprising:

forming the first die to include the first metal structure having a first metal coefficient of thermal expansion, and the first dielectric material having a first dielectric coefficient of thermal expansion greater than the first metal coefficient of thermal expansion; and forming the second die to include the second metal structure having a second metal coefficient of thermal expansion, and the second dielectric material having a second dielectric coefficient of thermal expansion greater than the second metal coefficient of thermal expansion.

18. The method of claim 17, wherein the forming of the first die comprises forming the first die to include the first metal structure having a first metal coefficient of thermal expansion in a range from 10 ppm/K to 20 ppm/K, and the first dielectric material having a first dielectric coefficient of thermal expansion in a range from 40 ppm/K to 60 ppm/K, and wherein the forming of the second die comprises forming the second die to include the second metal structure having a second metal coefficient of thermal expansion in a range from 10 ppm/K to 20 ppm/K, and the second dielectric material having a second dielectric coefficient of thermal expansion in a range from 40 ppm/K to 60 ppm/K.

19. The method of claim 17, wherein the forming of the first die comprises forming the first die to include the first dielectric material comprising one of polyimide, polybenzoxazole, polymethyl methacrylate, or benzocyclobutene, and the forming of the second die comprises forming the second die to include the second dielectric material comprising one of polyimide, polybenzoxazole, polymethyl methacrylate, or benzocyclobutene.

20. A method of bonding a first die and a second die, the method comprising:

placing the first die on the second die such that a first metal structure of the first die contacts a second metal structure of the second die;

forming a metal-to-metal bond between the first metal structure and the second metal structure;

forming a dielectric-to-dielectric bond between a first dielectric material of the first die and a second dielectric material of the second die; and concurrently with the forming of the dielectric-to-dielectric bond, deforming at least one of the first dielectric material and the second dielectric material to form a deformed region of dielectric material in a void between the first die and the second die, wherein the deformed region has a width in a range between 0 nm and 1 nm.

* * * * *